(12) United States Patent
Zhu

(10) Patent No.: US 11,677,001 B2
(45) Date of Patent: Jun. 13, 2023

(54) SEMICONDUCTOR DEVICE WITH C-SHAPED CHANNEL PORTION, METHOD OF MANUFACTURING THE SAME, AND ELECTRONIC APPARATUS INCLUDING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 17/153,842

(22) Filed: Jan. 20, 2021

(65) Prior Publication Data
US 2021/0226004 A1    Jul. 22, 2021

(30) Foreign Application Priority Data

Jan. 21, 2020 (CN) .......................... 202010072948.3

(51) Int. Cl.
*H01L 29/06* (2006.01)
*H01L 29/10* (2006.01)
(Continued)

(52) U.S. Cl.
CPC .... *H01L 29/0673* (2013.01); *H01L 21/02293* (2013.01); *H01L 21/30608* (2013.01); *H01L 29/1037* (2013.01); *H01L 29/66477* (2013.01)

(58) Field of Classification Search
CPC ......... H01L 21/02293; H01L 21/30608; H01L 21/823487; H01L 21/823885;
(Continued)

(56) References Cited

U.S. PATENT DOCUMENTS

2003/0230774 A1   12/2003   Roijen
2005/0266645 A1   12/2005   Park
(Continued)

FOREIGN PATENT DOCUMENTS

CN   1702843      11/2005
CN   105448723    3/2016
(Continued)

OTHER PUBLICATIONS

Chinese Office Action, issued in the corresponding Chinese application patent application No. 202010072948.3, dated Apr. 8, 2023, 12 pages with translation.

*Primary Examiner* — David C Spalla
(74) *Attorney, Agent, or Firm* — Hamre, Schumann, Mueller & Larson, P.C.

(57) ABSTRACT

The present disclosure discloses a semiconductor device with C-shaped channel portion, a method of manufacturing the same, and an electronic apparatus including the same. According to the embodiments, the semiconductor device may comprise a channel portion on a substrate, the channel portion including two or more curved nanosheets or nanowires spaced apart from each other in a lateral direction relative to the substrate and each having a C-shaped cross section; source/drain portions respectively located at upper and lower ends of the channel portion relative to the substrate; and a gate stack surrounding an outer circumference of each nanosheet or nanowire in the channel portion.

38 Claims, 26 Drawing Sheets

(51) Int. Cl.
*H01L 29/66* (2006.01)
*H01L 21/306* (2006.01)
*H01L 21/02* (2006.01)

(58) Field of Classification Search
CPC ............. H01L 29/0676; H01L 29/1037; H01L 29/66477; H01L 29/66666; H01L 29/7827; H01L 29/78642; H01L 29/7788
See application file for complete search history.

(56) References Cited

U.S. PATENT DOCUMENTS

| | | | | |
|---|---|---|---|---|
| 2007/0012996 | A1* | 1/2007 | Yoon | H01L 27/115 |
| | | | | 257/329 |
| 2007/0082448 | A1* | 4/2007 | Kim | H01L 27/10876 |
| | | | | 257/E21.41 |
| 2007/0181925 | A1* | 8/2007 | Yoon | H01L 29/66666 |
| | | | | 257/296 |
| 2007/0246783 | A1* | 10/2007 | Moon | H01L 29/1037 |
| | | | | 257/E21.627 |
| 2007/0290258 | A1* | 12/2007 | Son | H01L 29/42376 |
| | | | | 257/E21.336 |
| 2009/0004861 | A1* | 1/2009 | Lee | H01L 27/10876 |
| | | | | 438/692 |

FOREIGN PATENT DOCUMENTS

| | | |
|---|---|---|
| CN | 106298778 | 1/2017 |
| CN | 107887440 | 4/2018 |
| CN | 107887444 | 4/2018 |

\* cited by examiner

SEMICONDUCTOR DEVICE WITH C-SHAPED CHANNEL PORTION, METHOD OF MANUFACTURING THE SAME, AND ELECTRONIC APPARATUS INCLUDING THE SAME

CROSS-REFERENCE TO RELATED APPLICATION

This application claims the benefit of Chinese Patent Application No. 202010072948.3 filed on Jan. 21, 2020 in the State Intellectual Property Office of China, the whole disclosure of which is incorporated herein by reference.

TECHNICAL FIELD

The present disclosure relates to a field of semiconductor, and in particular to a semiconductor device with a C-shaped nanosheet or nanowire channel portion, a method of manufacturing the same, and an electronic apparatus including such a semiconductor device.

BACKGROUND

With the continuous miniaturization of semiconductor devices, devices with various structures such as Fin Field Effect Transistors (FinFET) and Multi-Bridge Channel Field Effect Transistors (MBCFET) etc., have been proposed. However, these devices still cannot meet the requirements on increasing integration density and enhancing device performance due to the limitation of device structure.

In addition, due to fluctuations in processes such as photolithography and etching, for vertical nanosheet or nanowire devices such as metal oxide semiconductor field effect transistors (MOSFETs), the thickness or diameter of the nanosheets or nanowires is difficult to control.

SUMMARY

In view of this, the object of the present disclosure is at least partially to provide a semiconductor device with a C-shaped nanosheet or nanowire channel, a method of manufacturing the same, and an electronic apparatus including such a semiconductor device.

According to one aspect of the present disclosure, there is provided a semiconductor device including a channel portion on a substrate, the channel portion comprising two or more curved nanosheets or nanowires spaced apart from each other in a lateral direction relative to the substrate and each having a C-shaped cross section; source/drain portions respectively located at upper and lower ends of the channel portion relative to the substrate; and a gate stack surrounding an outer circumference of each nanosheet or nanowire in the channel portion.

According to another aspect of the present disclosure, there is provided a method of manufacturing a semiconductor device, including arranging a stack of a first material layer, a second material layer, and a third material layer on a substrate; patterning the stack into a bar-shaped structure extending in a first direction; on opposite sides of the bar-shaped structure in a second direction intersecting with the first direction, laterally recessing a sidewall of the second material layer relative to sidewalls of the first material layer and the third material layer, so as to define a first recessed portion; forming a first channel layer on a sidewall of the second material layer exposed by the first recessed portion; forming a first position maintaining layer in a remaining space of the first recessed portion; forming source/drain portions in the first material layer and the third material layer; separating the bar-shaped structure into several segments in the first direction; forming an isolation layer on the substrate; removing the second material layer and the first position maintaining layer; and forming a gate stack around the first channel layer on the isolation layer.

According to another aspect of the present disclosure, there is provided an electronic apparatus including the above semiconductor device.

According to the embodiments of the present disclosure, a semiconductor device having a new structure is provided, which has the advantages of high performance and high density.

BRIEF DESCRIPTION OF THE DRAWINGS

The above and other objectives, features, and advantages of the present disclosure will be clearer by reference to the following description of the embodiments of the present disclosure in combination with the accompanying drawings. In the accompanying drawings:

FIGS. 1-24(c) schematically show some stages in the process of manufacturing a semiconductor device according to the embodiments of the present disclosure;

FIGS. 26-29 schematically show some stages in the process of manufacturing a semiconductor device according to another embodiment of the present disclosure, wherein, FIGS. 1, 2, 3(a), 4 to 9, 10(a), 10(b), 11, 12, 13(a), 13(b), 16(a), 17(a), 18(a), 19(a), 21(a), 22(a), 23(a), 24(a) and 26 to 29 are sectional views along AA' line;

FIGS. 3(b), 3(c), 14(a), 14(b), 15(a), 19(d), 20 and 24(c) are top views;

FIGS. 15(b), 16(b), 16(c), 17(b), 17(c), 18(b), 19(b), 21(b), 22(b), 23(b) and 24(b) are sectional views along BB' line;

FIGS. 18(c), 19(c), 21(c), 22(c) and 23(c) are sectional views along CC' line;

FIG. 25 is a partial sectional view along AA' line.

Figure 1:
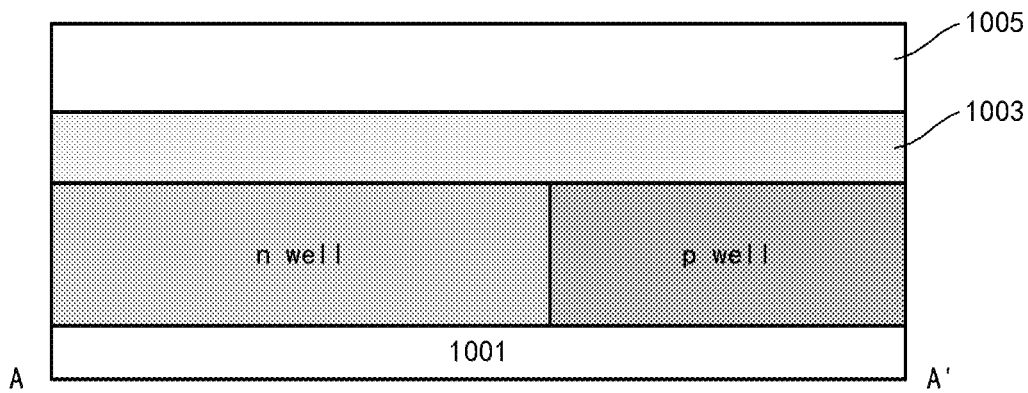

Throughout the drawings, the same or similar reference signs indicate the same or similar components.

DETAILED DESCRIPTION OF EMBODIMENTS

The embodiments of the present disclosure are described below with reference to the drawings. However, it should be understood that these descriptions are only exemplary and are not intended to limit the scope of the present disclosure. In addition, the commonly known structures and technologies are omitted in the following description to avoid unnecessarily obscuring the concepts of the present disclosure.

The drawings show various structural schematic diagrams according to the embodiments of the present disclosure. These figures are not drawn to scale, and some details are enlarged and some details may be omitted for clarity of presentation. The shapes of various regions and layers as well as the relative sizes and positional relationships thereof shown in the figures are only exemplary. In practice, there may be deviations due to manufacturing tolerances or technical limitations, and those skilled in the art may additionally design regions/layers having different shapes, sizes, and relative positions as required.

In the context of the present disclosure, when a layer/an element is referred to as being "on" another layer/element, the layer/element may be directly on another layer/element, or there may be an intermediate layer/element between them. In addition, if a layer/an element is located "on" another layer/element in one orientation, the layer/element may be located "under" another layer/element when the orientation is reversed.

According to one embodiment of the present disclosure, there is provided a vertical semiconductor device, having active regions arranged vertically on a substrate (for example, in a direction substantially perpendicular to a surface of the substrate). The channel portion may include two or more curved nanosheets or nanowires spaced apart from each other in a lateral direction relative to the substrate (for example, a second direction described below) and each having a C-shaped cross section (for example, a cross section perpendicular to a surface of the substrate, the cross section may also be perpendicular to the first direction described below), and thus such a device may be called a multi-C channel field effect transistor (C-Channel FET), namely mCCFET. The channel portion comprises a plurality of nanosheets or nanowires, which may enhance the current driving capability of the device. As described below, each nanosheet or nanowire may be formed by epitaxial growth, and thus it may be one integrated single piece and may have a substantially uniform thickness.

At least some of the nanosheets or nanowires included in the semiconductor device may be different in at least one aspect of thickness, material, and doping concentration to adjust the device performance. The number of nanosheets or nanowires included in the channel portion may be different among different semiconductor devices on the substrate. Similarly, nanosheets or nanowires may be different in at least one aspect of thickness, material, and doping concentration among different semiconductor devices.

At least some of the nanosheets or nanowires in the channel portion may comprise a plurality of sub-nanosheets or sub-nanowires which are sequentially stacked in a second direction and each have a C-shaped cross section (for example, a cross section perpendicular to a surface of the substrate, the cross section may also be perpendicular to the first direction). Here, the sub-nanosheets or sub-nanowires may be the same or similar in physical configuration to the nanosheets or nanowires, but the sub-nanosheets or sub-nanowires may abut each other side by side, such that they seem to form one integrated single "nanosheet or nanowire". Therefore, descriptions here about nanosheets or nanowires may be also applied to sub-nanosheets or sub-nanowires.

At least some of a plurality of sub-nanosheets or sub-nanowires included in the same nanosheet or nanowire may have different characteristics to optimize the device performance. For example, the plurality of sub-nanosheets or sub-nanowires may comprise a first sub-nanosheets or sub-nanowire and a second sub-nanosheet or sub-nanowire respectively located on both sides of a corresponding nanosheet or nanowire in the second direction, and a third sub-nanosheet or sub-nanowire located between the first sub-nanosheet or sub-nanowire and the second sub-nanosheet or sub-nanowire. The first sub-nanosheet or sub-nanowire and the second sub-nanosheet or sub-nanowire may have an improved interface quality with a gate stack, and the third sub-nanosheet or sub-nanowire may have a high carrier mobility. Additionally or alternatively, the first sub-nanosheet or sub-nanowire and the second sub-nanosheet or sub-nanowire may have high carrier mobility, and the third sub-nanosheet or sub-nanowire may optimize the carrier distribution. Additionally or alternatively, the third sub-nanosheet or sub-nanowire may confine the carriers within the first sub-nanosheet or sub-nanowire and/or the second sub-nanosheet or sub-nanowire. For example, for an n-type device, the lowest energy level of a conduction band of the third sub-nanosheet or sub-nanowire may be higher than the lowest energy level of a conduction band of the first sub-nanosheet or sub-nanowire and/or the second sub-nanosheet or sub-nanowire. For a p-type device, the highest energy level of a valence band of the third sub-nanosheet or sub-nanowire may be lower than the highest energy level of a valence band of the first sub-nanosheet or sub-nanowire and/or the second sub-nanosheet or sub-nanowire.

The number of sub-nanosheets or sub-nanowires included in different nanosheets or nanowires may be different. In addition, the number of sub-nanosheets or sub-nanowires in a sub-nanosheet or sub-nanowire stack may be different among different devices on the substrate.

The semiconductor device may further include source/drain portions respectively arranged at upper and lower ends of the channel portion. A size of the source/drain portion in the lateral direction relative to the substrate may be larger than a size of the channel portion in a corresponding direction so as to ensure that the upper and lower ends of the channel portion are connected to the source/drain portions. The source/drain portion may have a certain doping. For example, for a p-type device, the source/drain portion may have a p-type doping; and for an n-type device, the source/drain portion may have an n-type doping. The channel portion may have a certain doping to adjust a threshold voltage of the device. Alternatively, the semiconductor device may be a junctionless device, in which the channel portion and the source/drain portion may have the same conductivity type doping. Alternatively, the semiconductor device may be a tunneling type device, in which the source/drain portions at both ends of the channel portion may have doping types opposite to each other.

The source/drain portion may be arranged in a corresponding semiconductor layer. For example, the source/drain portion may be a doped region in the corresponding semiconductor layer. The source/drain portion may be a part or a whole of the corresponding semiconductor layer. In a case where the source/drain portion is a part of the corresponding semiconductor layer, a doping concentration interface may exist between the source/drain portion and a remaining part of the corresponding semiconductor layer. As described below, the source/drain may be formed by diffusion doping. In this case, the doping concentration interface may be substantially along the vertical direction relative to the substrate.

The channel portion may include a single crystal semiconductor material. Of course, the source/drain portion or the semiconductor layer where it is formed may also include a single crystal semiconductor material. For example, they may all be formed by epitaxial growth.

The semiconductor device may further comprises a gate stack surrounding the outer circumference of the channel portion, more specifically surrounding the outer circumference of each channel layer in the channel portion. Therefore, the semiconductor device according to the embodiments of the present disclosure may be a wrap gate device. According to the embodiments of the present disclosure, the gate stack may be self-aligned to the channel portion. For example, at least a portion of the gate stack adjacent to the channel portion may be substantially coplanar with the channel portion, for example, the portion of the gate stack and the upper surface and/or the lower surface of the channel portion are substantially coplanar with each other.

Such a semiconductor device may be manufactured, for example, as follows.

According to one embodiment, a stack of a first material layer, a second material layer, and a third material layer may be provided on a substrate. The first material layer may define a position of a lower source/drain portion, the second material layer may define a position of a gate stack, and the third material layer may define a position of an upper source/drain portion. The first material layer may be provided by the substrate, such as an upper portion of the substrate, and the second material layer and the third material layer may be sequentially formed on the first material layer by, for example, epitaxial growth. Alternatively, the first material layer, the second material layer, and the third material layer may be sequentially formed on the substrate by, for example, epitaxial growth. The first material layer and the third material layer may be doped in situ while being epitaxially grown so as to form source/drain portions therein.

The stack may be patterned into a bar-shaped structure extending in the first direction. On the opposite sides of the bar-shaped structure in the second direction intersecting with (for example, perpendicular to) the first direction, sidewalls of the second material layer may be laterally recessed relative to sidewalls of the first material layer and the third material layer, thereby defining a first recessed portion. The first recessed portion may have a curved surface recessed toward an inner side of the bar-shaped structure.

The channel portion may be formed on a sidewall of the first recessed portion (i.e., an exposed sidewall of the second material layer in the first recessed portion). For example, a first active layer may be formed by epitaxial growth on an exposed surface of the bar-shaped structure, and a portion of the first active layer located on the surface of the first recessed portion may be used as the channel portion (also called "(first) channel layer"). Two first channel layers may be formed based on the first active layer on the opposite sidewalls of the bar-shaped structure. Thus, a multi-channel device may be formed. A first position maintaining layer may be formed in the first recessed portion on the surface of which the first channel layer is formed.

After the first recessed portion is defined and before the first active layer is formed, the exposed surface of the bar-shaped structure may be etched back by a certain amount, for example, approximately a thickness of the first active layer to be formed. This helps to ensure that the subsequently formed gate stack has substantially equal gate lengths on the opposite sides of the channel layer resulting from the first active layer.

In order to achieve more channel layers, similar processing may be performed. For example, on the opposite sides of the bar-shaped structure in the second direction, sidewalls of the first position maintaining layer may be laterally recessed relative to sidewalls of the first material layer and the third material layer, thereby defining a second recessed portion. The second recessed portion may have a curved surface recessed toward an inner side of the bar-shaped structure. A second channel layer may be formed on a sidewall of the second recessed portion (i.e., an exposed sidewall of the first position maintaining layer in the first recessed portion), by, for example, epitaxial growth. In order to realize epitaxial growth, the first position maintaining layer may be formed by epitaxial growth. A second position maintaining layer may be formed in the second recessed portion on the surface of which the second channel layer is formed.

Similarly, after the second recessed portion is defined and before the second channel layer is formed, an etch-back operation may also be performed, and the amount of etch-back is, for example, approximately a thickness of the second channel layer.

Through such recess-growth process, more channel layers may be realized.

The source/drain portions may be formed in the first material layer and the third material layer. For example, the source/drain portions may be formed by doping the first material layer and the third material layer (in particular, in a condition that they are not doped when they are formed). Such doping may be achieved by a solid phase dopant source layer.

Openings (for example, extending in the second direction) may be formed in the bar-shaped structure to divide the bar-shaped structure into several segments (respectively used as active regions of adjacent devices in the first direction) in the first direction. The openings may extend substantially in the second direction. Through the openings, the second material layer and the position maintaining layer on the inner side may be exposed.

The second material layer and each position maintaining layer may be replaced by gate stack layers through a gate replacement process, thereby forming a gate stack surrounding each channel layer in the channel portion.

According to another embodiment of the present disclosure, another opening (for example, extending in the first direction) may be formed in the bar-shaped structure to divide the bar-shaped structure into, for example, two portions in the second direction. The opening may be in the middle of the bar-shaped structure extending in the first direction, such that the two portions may be substantially symmetrical with respect to each other.

According to the embodiments of the present disclosure, the thickness and the gate length of the nanosheets or nanowires used as the channel portion as well as the sub-nanosheets or sub-nanowires that may exist are mainly determined by epitaxial growth, rather than by etching or photolithography. Therefore, channel size/thickness and gate length may be well controlled.

The present disclosure may be presented in various forms, some embodiments of which will be described below. In the following description, the selection of various materials is involved. In addition to their functions (for example, semiconductor materials are used to form active regions and dielectric materials are used to form electrical isolation), etching selectivity is also considered to select materials. In the following description, the required etching selectivity may or may not be indicated. Those skilled in the art should be clear that when etching a certain material layer is mentioned below, if it is not mentioned that other layers are also etched or the figure does not show that other layers are also etched, then such etching may be selective, and the material layer may have an etching selectivity with respect to other layers exposed to the same etching recipe.

FIGS. 1 to 24(c) schematically illustrate some stages in the process of manufacturing a semiconductor device according to an embodiment of the present disclosure.

As shown in FIG. 1, there is provided a substrate 1001 (an upper portion of which may form the above first material layer). The substrate 1001 may be a substrate in various forms, including but not limited to a semiconductor material substrate such as a bulk Si substrate, a semiconductor-on-insulator (SOI) substrate, a compound semiconductor substrate such as a SiGe substrate, and the like. In the following description, for convenience of description, a bulk Si substrate is taken as an example for description. Here, a silicon wafer is provided as the substrate 1001.

In the substrate 1001, a well region may be formed. If a p-type device is to be formed, the well region may be an n-type well; and if an n-type device is to be formed, the well region may be a p-type well. The well region may be formed, by, for example, injecting a corresponding conductivity type dopant (p-type dopants such as B or In, or n-type dopants such as As or P) into the substrate 1001 and then performing thermal annealing. There are many manners to set such a well region in the art, which will not be repeated here.

In this embodiment, an example is described in which a p-type device and an n-type device are formed at the same time, and the p-type device and the n-type device are adjacent to each other (a complementary metal oxide semiconductor (CMOS) configuration may then be formed), thereby forming adjacent n-type well and p-type well. However, the present disclosure is not limited to this. For example, devices having the same conductivity type may be formed. Alternatively, devices having different conductivity types may be formed, but the p-type device is formed in a certain region and the n-type device is formed in another region.

On the substrate 1001, a second material layer 1003 and a third material layer 1005 may be formed by, for example, epitaxial growth. The second material layer 1003, having a thickness of, for example, about 20 nm-50 nm, may be used to define a position of a gate stack. The third material layer 1005, having a thickness of, for example, about 20 nm-200 nm, may be used to define a position of an upper source/drain portion.

Adjacent layers in the substrate 1001 and the above layers formed thereon may have an etching selectivity with respect to each other. For example, in a condition that the substrate 1001 is a silicon wafer, the second material layer 1003 may include SiGe (for example, an atomic percentage of Ge is about 10%-30%), and the third material layer 1005 may include Si.

Figure 2:
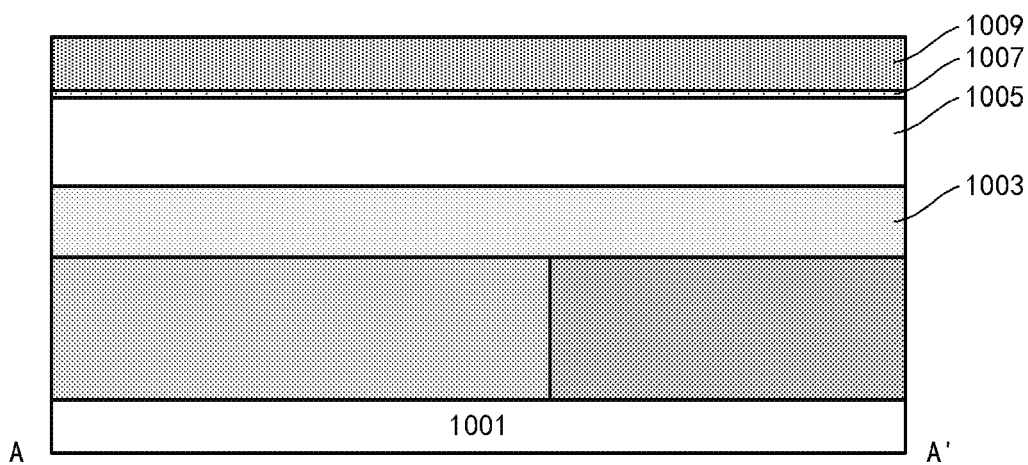

To facilitate patterning, as shown in FIG. 2, a hard mask layer 1009 may be formed on the third material layer 1005 by, for example, deposition. For example, the hard mask layer 1009 may include nitride (for example, silicon nitride) and have a thickness of about 30 nm-100 nm. In addition, for better etching control, an etching stop layer 1007 may be first formed by, for example, deposition. For example, the etching stop layer 1007 may include oxide (for example, silicon oxide) and have a thickness of about 1 nm-10 nm.

The hard mask layer 1009 may be used to pattern an active region.

Figure 3A:
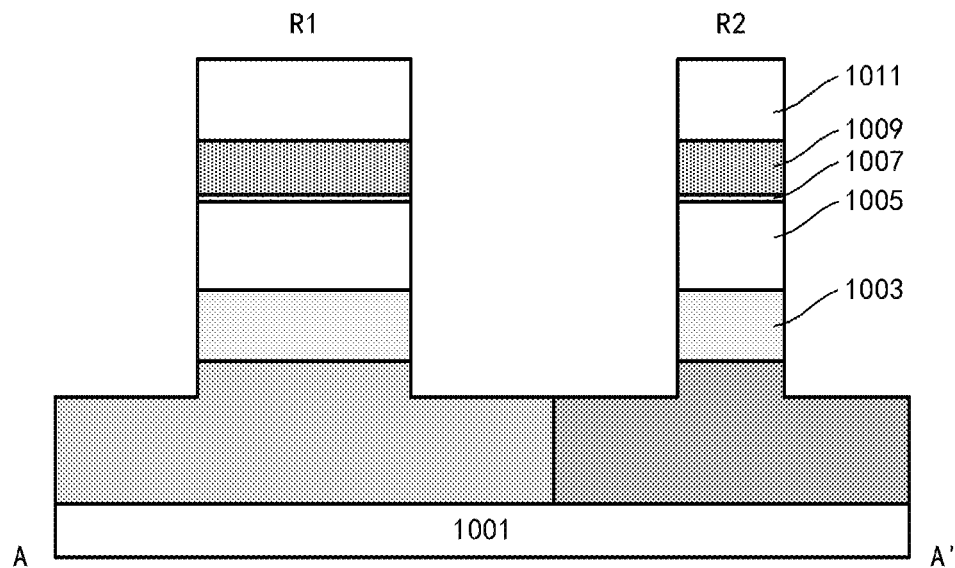
Figure 3B:
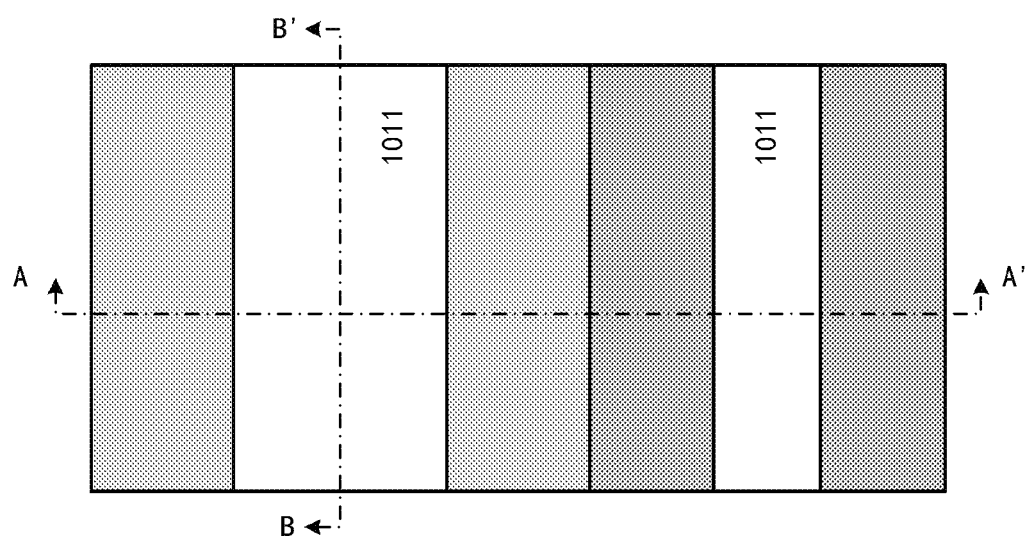
Figure 3C:
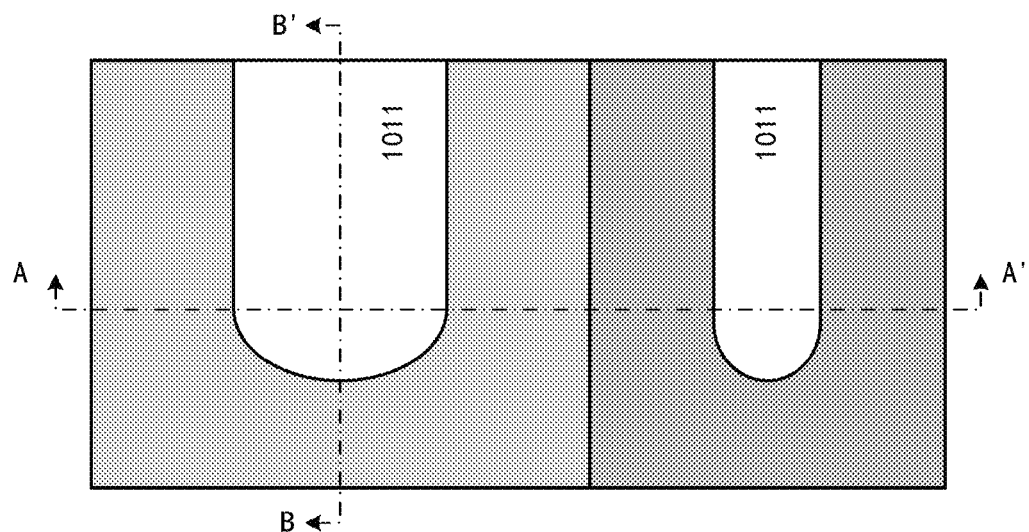

For example, as shown in FIGS. 3(*a*) and 3(*b*), a photoresist 1011 may be formed on the hard mask layer 1009 and patterned by photolithography into a bar shape extending in the first direction (a direction perpendicular to the paper in FIG. 3(*a*), and a vertical direction in the paper in FIG. 3(*b*)). The photoresist 1011 may be used as an etching mask, the hard mask layer 1013 is selectively etched by, for example, reactive ion etching (RIE), and the pattern of the photoresist is transferred to the hard mask layer 1013. The etching may stop at the etching stop layer 1009. Then, selective etching may be sequentially performed to lower layers by, for example, RIE. The etching may be performed into the substrate 1001, in particular, the well region therein.

Thus, on the p-type device region (a region above the n-type well region) and the n-type device region (a region above the p-type well region), the third material layer 1005, the second material layer 1003 and an upper portion of the substrate 1001 (the first material layer) are respectively patterned into bar-shaped structures R1 and R2.

In this example, the bar-shaped structure R1 on the p-type device region is wider than the bar-shaped structure R2 on the n-type device region, because a larger number of channel layers are formed for the p-type device in this example. However, the present disclosure is not limited to this, and the widths of the bar-shaped structures R1 and R2 (the dimensions in the horizontal direction in the paper in FIGS. 3(*a*) and 3(*b*)) may be adjusted according to the number of channel layers to be formed.

In addition, in the example shown in FIG. 3(*b*), the bar-shaped structures R1 and R2 extend continuously along the first direction (corresponding to the active regions of several devices, which are then separated). It is noted that FIG. 3(*b*) only shows a partial region on the wafer, and thus the upper and lower ends in FIG. 3(*b*) may not be the true ends of the bar-shaped structures R1 and R2, and the bar-shaped structures R1 and R2 may extend in the first direction beyond the range shown in FIG. 3(*b*).

FIG. 3(*c*) shows the ends of the bar-shaped structures R1 and R2. As described below, at the ends of the bar-shaped structures R1 and R2, channel layers may also be formed subsequently. In order to make the channel layers to extend continuously and smoothly, the ends of the bar-shaped structures R1 and R2 may in a rounded shape.

In the following, for convenience, the situation shown in FIG. 3(*b*) is mainly taken as an example for description.

In this example, the depth of the etching into the well region is not great, such that a contact region for the lower source/drain portion is subsequently formed around the lower source/drain portion. According to the embodiments of the present disclosure, the substrate 1001 may be further etched around the contact region, thereby forming a groove in the substrate 1001. In the formed groove, an isolation, for example a shallow trench isolation (STI), may be formed subsequently.

According to the embodiments of the present disclosure, a self-aligned manner may be used to define a region to be formed as the contact region for the lower source/drain portion.

Figure 4:
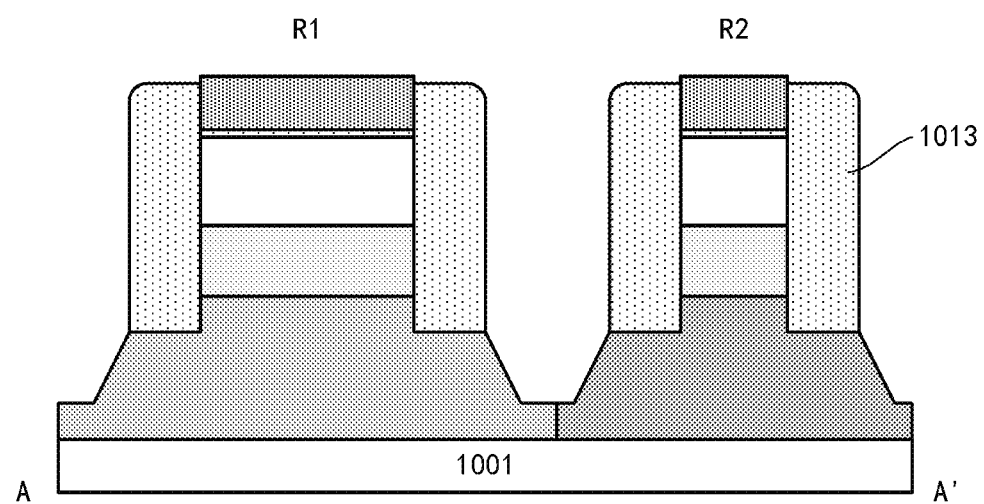

For example, as shown in FIG. 4, a spacer 1013 may be formed on the sidewalls of the bar-shaped structures R1 and R2, in particular on the opposite sidewalls in the second direction intersecting with (for example, perpendicular to) the first direction. For example, a layer of oxide may be deposited in a substantially conformal manner (the thickness may be adjusted according to the size of the contact region to be formed), and then an anisotropic etching such as RIE is performed to the deposited oxide layer along a vertical direction so as to remove its lateral extension portion and remain its vertical extension portion, thereby obtaining the spacer 1013.

The hard mask layer 1009 and the spacer 1013 may be used as an etching mask to selectively etch the substrate 1001, such as RIE, so as to form grooves for isolation in the substrate 1001. These grooves are also self-aligned to the bar-shaped structures R1 and R2 and formed around the bar-shaped structures R1 and R2. This helps to save area.

Here, the grooves between the p-type device region and the n-type device region pass through a pn junction between the n-type well and the p-type well.

Figure 5:
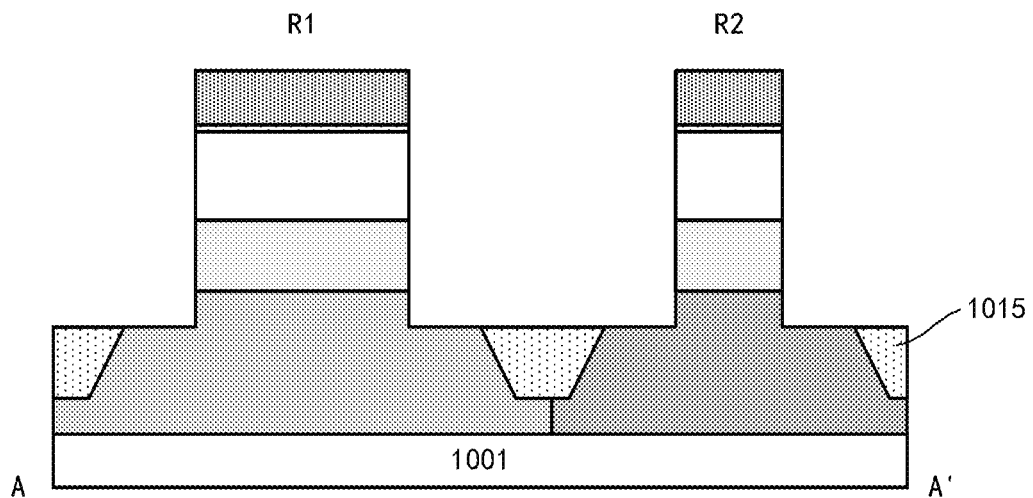

The grooves may be filled with a dielectric material such as oxide to form an STI. For example, as shown in FIG. 5, an oxide may be formed on the substrate by, for example, deposition. Planarization processing such as chemical mechanical polishing (CMP) (CMP may be stopped at the hard mask layer 1009) may be performed to the deposited oxide, which will then be etched back. Etching back may be performed until the surface of the substrate 1001 originally shielded by the spacer 1013 is exposed so as to form an isolation layer 1015. During the etching back, the spacer 1013, which is also an oxide, may be removed.

Afterwards, source/drain doping may be performed.

Figure 6:
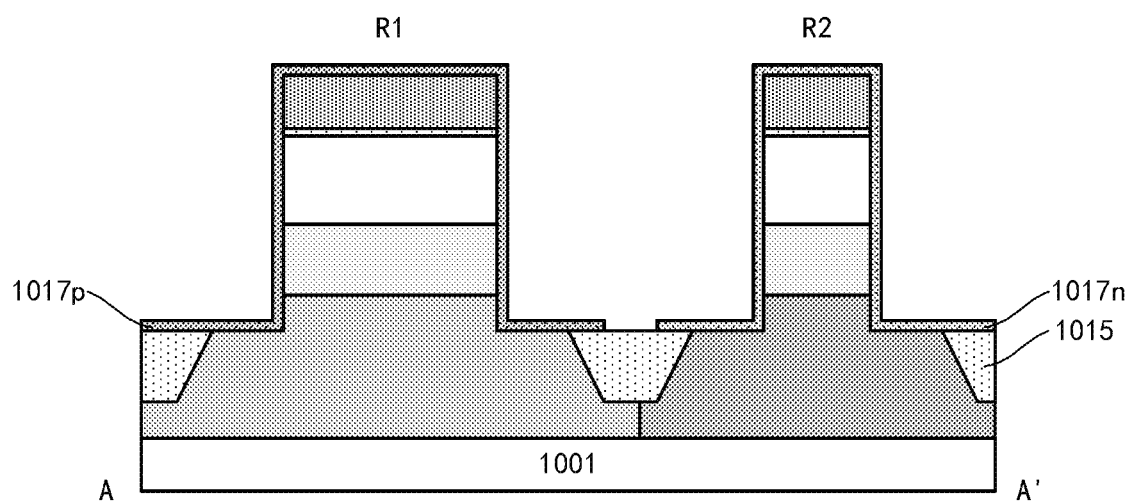

As shown in FIG. 6, a solid phase dopant source layer may be formed on the sidewalls of the bar-shaped structures R1 and R2 by, for example, deposition. Here, solid phase dopant source layers may be respectively formed for a p-type device and an n-type device. For example, a solid phase dopant source layer 1017p may be formed for a p-type device, and the solid phase dopant source layer 1017p may be positioned in the p-type device region by photolithography, in particular covering the bar-shaped structure R1 therein. Similarly, a solid phase dopant source layer 1017n may be formed for an n-type device, and the solid phase dopant source layer 1017n may be positioned in the n-type device region by photolithography, in particular covering the bar-shaped structure R2 therein.

The solid phase dopant source layers 1017p and 1017n may be formed in a substantially conformal manner. For example, the solid phase dopant source layers 1017p and 1017n may be oxides containing dopants and have a thickness of about 1 nm-5 nm. The dopants contained in the solid phase dopant source layers 1017p and 1017n may be used to dope the source/drain portions (and optionally, the exposed surface of the substrate 1001), and thus may have the same conductivity type as the source/drain portion to be formed. For example, for a p-type device, the solid phase dopant source layer 1017p may contain p-type dopants such as B or In; and for an n-type device, the solid phase dopant source layer 1017n may contain n-type dopants such as P or As. The concentration of the dopants of the solid phase dopant source layers 1017p, 1017n may be about 0.1%-5%.

Figure 7:
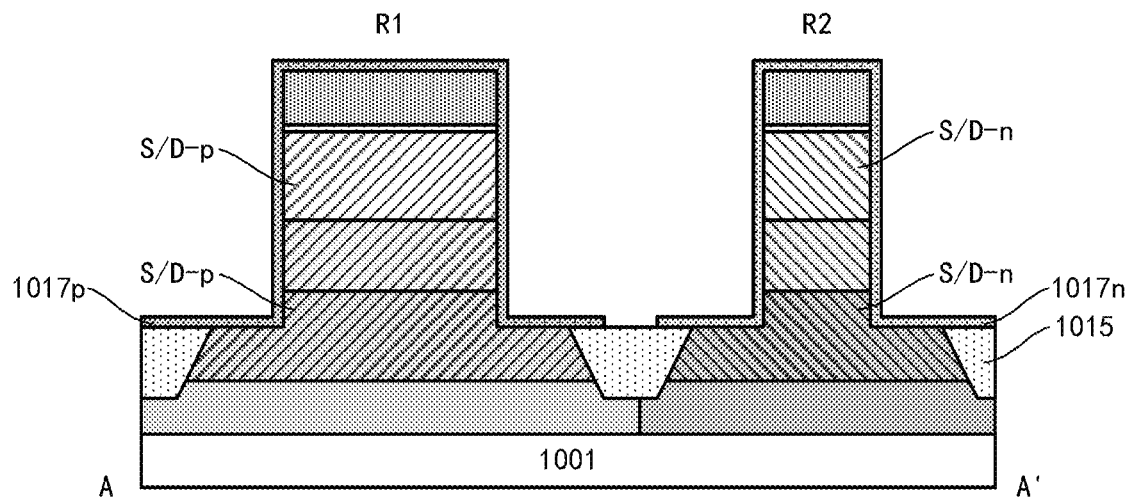

The dopants in the solid phase dopant source layers 1017p and 1017n may be driven into the first material layer and the third material layer through annealing treatment to form source/drain portions S/D-p for a p-type device and source/drain portions S/D-n for an n-type device (and optionally, they may be driven into the exposed surface of the substrate 1001 to form respective contact regions of the source/drain portions at the lower ends of the two devices), as shown in FIG. 7. The concentration of the dopants in the source/drain portions may be about $1E18-1E21$ $cm^{-3}$. Afterwards, the solid phase dopant source layers 1017p, 1017n may be removed.

In FIG. 7, the region into which the dopants are driven is schematically shown with diagonal hatchings. In the following illustrations, for the purpose of conciseness, these diagonal hatchings are not shown any more.

In this example, the first material layer is provided through the upper portion of the substrate 1001. However, the present disclosure is not limited to this. For example, the first material layer may also be an epitaxial layer on the substrate 1001. In this case, the first material layer and the third material layer may be doped in-situ during epitaxy, rather than being doped using a solid phase dopant source layer.

Next, a channel layer may be fabricated.

Figure 8:
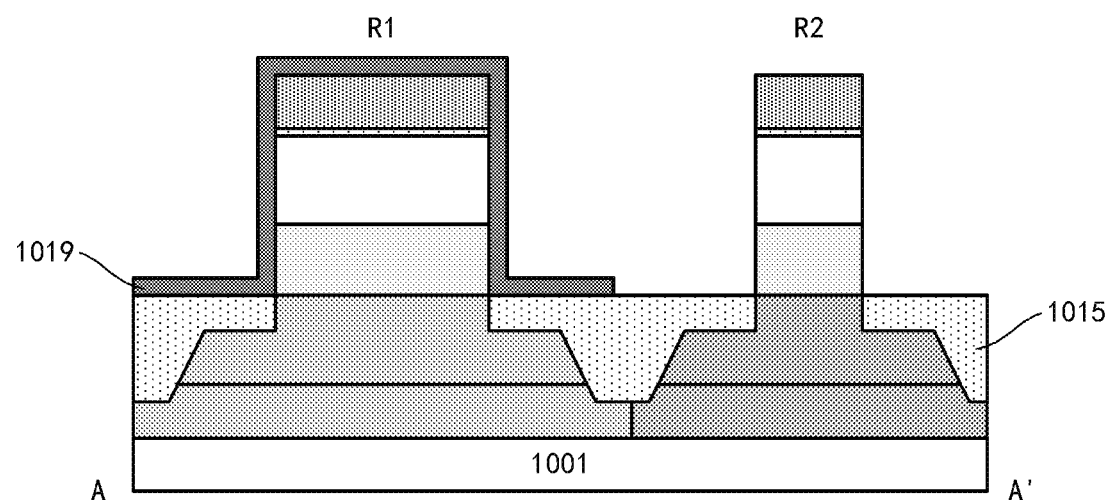

In this example, the channel layers for the p-type device and the n-type device are different (in at least one aspect of quantity, material, thickness, doping, etc.), and thus the p-type device and the n-type device may be processed separately. As shown in FIG. 8, a shielding layer 1019 may be formed on the p-type device region by, for example, deposition and etching. For example, the shielding layer 1019 may include SiC.

In addition, before the shielding layer 1019 is formed, the thickness of the isolation layer 1015 may be increased. For example, the thickness of the isolation layer 1015 may be increased to shield the contact region for the lower source/drain portion (so as to prevent the channel layer from growing on the contact region). Of course, a top surface of the thickened isolation layer 1015 may not exceed a bottom surface of the second material layer, so as not to affect the formation of the channel layer on the sidewall of the second material layer. The thickening of the isolation layer 1015 may be achieved by depositing an oxide, planarizing the deposited oxide, and then etching back the oxide.

Figure 9:
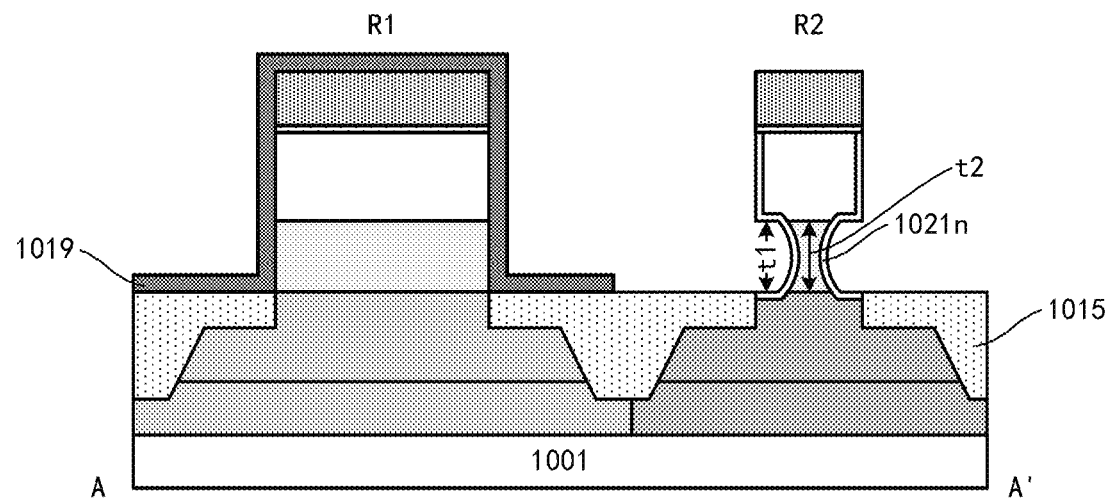

According to the embodiments of the present disclosure, in order to form a gate stack surrounding the channel portion, a space for the gate stack may be left on the side of the bar-shaped structure R2, in particular on both sides in the second direction. For example, as shown in FIG. 9, a selective etching may be performed to the second material layer 1003 so as to relatively recess sidewalls thereof in the second direction. In order to better control the amount of etching, an atomic layer etching (ALE) may be used. For example, the amount of etching may be about 10 nm-40 nm. Depending on the characteristics of the etching, for example, the etching selectivity of the second material layer 1003 relative to the substrate 1001 and the third material layer 1005, the sidewall of the second material layer 1003 after etching may exhibit different shapes. FIG. 9 shows that the sidewall of the second material layer 1003 after etching is a C-shape recessed inward. However, the present disclosure is not limited to this. For example, when the etching selectivity is good, the sidewall of the second material layer 1003 after etching may be almost vertical. Here, the etching may be isotropic, in particular when a larger etching amount is required. The C-shapes formed on both sides may be symmetrical relative to each other, for example, symmetrical relative to a center plane of the bar-shaped structure R2. Generally, the C-shaped side wall of the second material layer 1003 has a larger curvature at the upper and lower ends, and a smaller curvature at the waist or in the middle.

A first channel layer for a n-type device may be formed on the sidewall of the bar-shaped structure R2, so as to subsequently define the channel portion. In order to keep the gate lengths (for example, in a direction perpendicular to the surface of the substrate) of the gate stacks subsequently formed on the left and right sides of the C-shaped channel layer substantially equal, as shown in FIG. 9, an etching back may be performed to the bar-shaped structure R2 (specifically, the exposed surfaces of the first material layer, the second material layer, and the third material layer) such that the outer peripheral sidewalls thereof are laterally recessed relative to the outer peripheral sidewalls of the hard mask layer 1009. In order to better control the amount of etching back, ALE may be used. The amount of etching back may be substantially equal to the thickness of the first channel layer that is subsequently grown, for example, about 5 nm-15 nm. Then, a first channel layer 1021n for an n-type device may be formed on the sidewall of the bar-shaped structure R2 by, for example, selective epitaxial growth. Due to the selective epitaxial growth, the first channel layer 1021n for an n-type device may not be formed on the surface of the isolation layer 1015. The first channel layer 1021n for an n-type device may then define a channel portion having a thickness of, for example, about 3 nm-15 nm. According to the embodiments of the present disclosure, the thickness of the first channel layer 1021*n* (which is then used as a channel portion) for an n-type device may be determined by the process of the epitaxial growth, and thus the thickness of the channel portion may be better controlled.

In FIG. 9, a portion of the sidewalls of the first channel layer 1021*n* for an n-type device on the sidewalls of the first material layer and the third material layer are shown as substantially flush to the sidewalls of the hard mask layer 1009. This may be achieved by controlling the amount of etching back and the thickness of the epitaxial growth to be substantially the same. However, the present disclosure is not limited to this. For example, a portion of the sidewalls of the first channel layer 1021*n* for an n-type device on the sidewalls of the first material layer and the third material layer may be recessed or even protrude relative to the sidewalls of the hard mask layer 1009.

Here, by performing the above etching back, the upper end and the lower end of the recessed portion may be etched upward and downward respectively, such that after the first channel layer 1021*n* is grown, the height t1 of the recessed portion and the thickness t2 of the second material layer 1003 may be substantially the same. In this way, the gate stacks subsequently formed on the left and right sides of the first channel layer 1021*n* may have substantially equal gate lengths. However, the present disclosure is not limited to this. According to the embodiments of the present disclosure, the gate length outside the first channel layer 1021*n* may also be changed by adjusting the amount of etching back, thereby changing the ratio of the gate lengths on both sides to optimize the effect of the difference in morphology on the left and right sides of the C-shaped channel portion on the device performance.

The material of the first channel layer 1021*n* for an n-type device may be appropriately selected according to the performance requirements of the device in the design. For example, the first channel layer 1021*n* for an n-type device may include various semiconductor materials, such as Si, Ge, SiGe, InP, GaAs, InGaAs, etc. . . . In this example, the first channel layer 1021*n* for an n-type device may include the same material as the first material layer and the third material layer, such as Si. In addition, when it is grown, the first channel layer 1021*n* for an n-type device may be doped in situ as required to adjust the threshold voltage of the n-type device.

Figure 10:
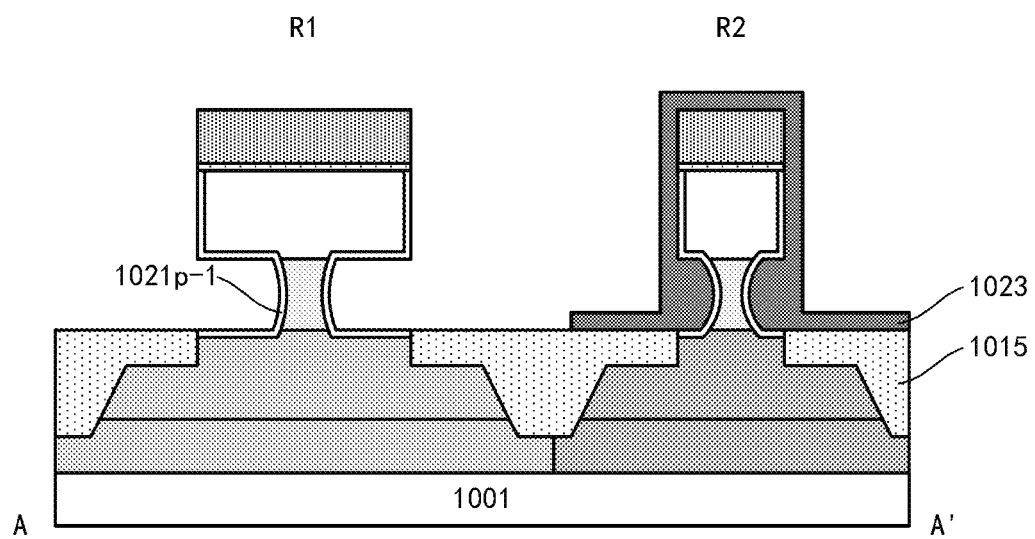
Figure 10:
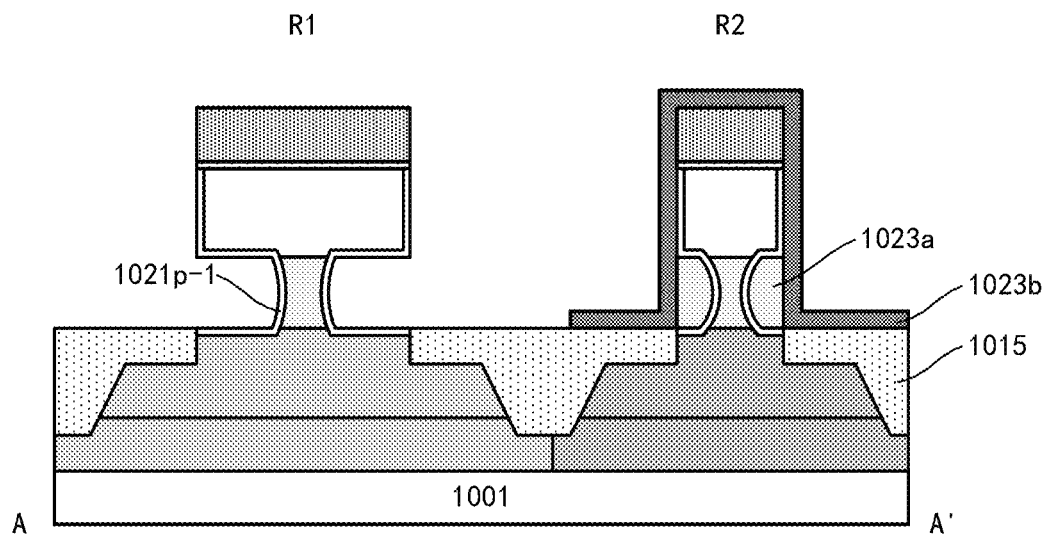
Figure 11:
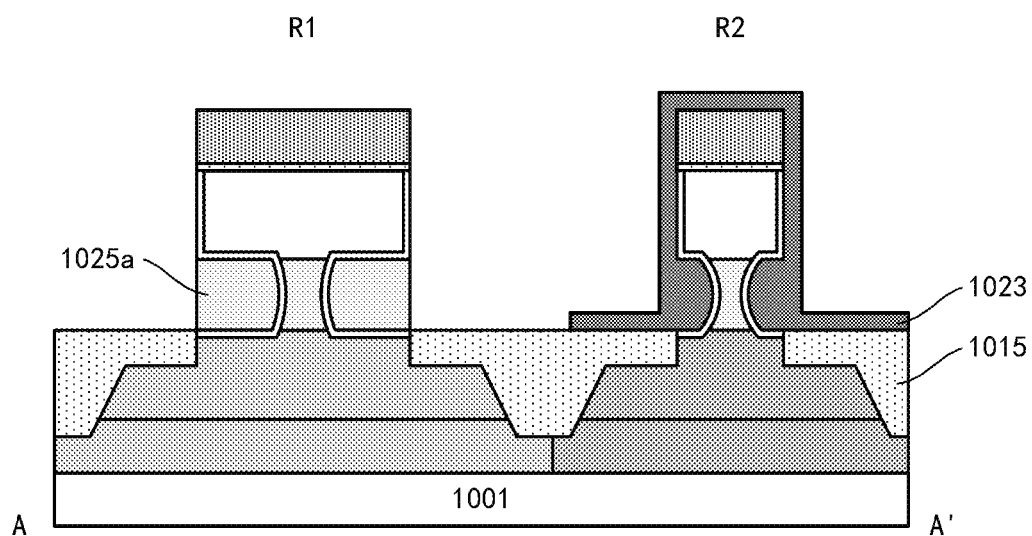

Next, the p-type device region may be processed similarly. As shown in FIG. 10(*a*), a shielding layer 1023 may be formed on the p-type device region by, for example, deposition and etching. For example, the shielding layer 1023 may include SiC. When etching is performed on the shielding layer 1023, the shielding layer 1019 on the p-type device region may be removed. In addition, the shielding layer 1023 may enter the recess of the bar-shaped structure R2 to form a position maintaining layer to maintain a space where a gate stack is subsequently formed.

In this example, the position maintaining layer and the shielding layer are formed together. However, the present disclosure is not limited to this. According to other embodiments of the present disclosure, the position maintaining layer may be separately formed. For example, as shown in FIG. 10(*b*), a position maintaining layer 1023*a* may be formed in the recess of the bar-shaped structure R2, and then a shielding layer 1023*b* may be formed to shield the n-type device region. In order to be able to be removed together with the second material layer 1003 in the following replacement gate process, the position maintaining layer 1023*a* may include the same material as the second material layer 1003, such as SiGe. The position holding layer 1023*a* may be formed by epitaxially growing SiGe, and then performing selective etching such as RIE (for example, using the hard mask layer 1009 as an etching mask) to the epitaxially grown SiGe. The concentration of Ge in SiGe included in the position maintaining layer 1023*a* may be substantially the same as the concentration of Ge in the second material layer 1003. Moreover, the position maintaining layer 1023*a* may be in-situ doped during growth to have substantially the same doping concentration as that in the second material layer 1003 (which is doped when a source/drain portion is formed). In this way, in the subsequent replacement gate process, the position maintaining layer 1023*a* and the second material layer 1003 may be removed at substantially the same etching rate.

Similarly, a space for the gate stack may be left on the side of the bar-shaped structure R1, in particular on both sides in the second direction. For example, as shown in FIGS. 10(*a*) and 10(*b*), a selective etching may be performed to the second material layer 1003 so as to relatively recess sidewalls thereof in the second direction. In order to better control the amount of etching, an atomic layer etching (ALE) may be used. For example, the amount of etching is large (because the number of the channel layers to be formed is large), and it may be about 20 nm-60 nm. Depending on the characteristics of the etching, for example, the etching selectivity of the second material layer 1003 relative to the substrate 1001 and the third material layer 1005, the sidewall of the second material layer 1003 after etching may exhibit different shapes. FIGS. 10(*a*) and 10(*b*) show that the sidewall of the second material layer 1003 after etching is a C-shape recessed inward. However, the present disclosure is not limited to this. For example, when the etching selectivity is good, the sidewall of the second material layer 1003 after etching may be almost vertical. Here, the etching may be isotropic, in particular when a larger etching amount is required. The C-shapes formed on both sides may be symmetrical relative to each other, for example, symmetrical relative to a center plane of the bar-shaped structure R1. Generally, the C-shaped side wall of the second material layer 1003 has a larger curvature at the upper and lower ends, and a smaller curvature at the waist or in the middle.

A first channel layer for a p-type device may be formed on the sidewall of the bar-shaped structure R1, so as to subsequently define the channel portion. In order to keep the gate lengths (for example, in a direction perpendicular to the surface of the substrate) of the gate stacks subsequently formed on the left and right sides of the C-shaped channel layer substantially equal, an etching back may be performed to the bar-shaped structure R1 (specifically, the exposed surfaces of the first material layer, the second material layer, and the third material layer) such that the outer peripheral sidewalls thereof are laterally recessed relative to the outer peripheral sidewalls of the hard mask layer 1009. In order to better control the amount of etching back, ALE may be used. The amount of etching back may be substantially equal to the thickness of the first channel layer that is subsequently grown, for example, about 5 nm-15 nm. Then, a first channel layer 1021*p*-1 for a p-type device may be formed on the sidewall of the bar-shaped structure R1 by, for example, selective epitaxial growth. Due to the selective epitaxial growth, the first channel layer 1021*p*-1 for a p-type device may not be formed on the surface of the isolation layer 1015. The first channel layer 1021*p*-1 for a p-type device may then define a channel portion having a thickness of, for example, about 3 nm-15 nm. According to the embodiments of the present disclosure, the thickness of the first channel layer 1021*p*-1 (which is then used as a channel portion) for a p-type device may be determined by the process of the epitaxial growth, and thus the thickness of the channel portion may be better controlled.

In FIGS. 10(a) and 10(b), a portion of the sidewalls of the first channel layer 1021p-1 for a p-type device on the sidewalls of the first material layer and the third material layer are shown as substantially flush to the sidewalls of the hard mask layer 1009. This may be achieved by controlling the amount of etching back and the thickness of the epitaxial growth to be substantially the same. However, the present disclosure is not limited to this. For example, a portion of the sidewalls of the first channel layer 1021p-1 for a p-type device on the sidewalls of the first material layer and the third material layer may be recessed or even protrude relative to the sidewalls of the hard mask layer 1009.

Similarly, by performing the above etching back, the upper end and the lower end of the recessed portion may be etched upward and downward respectively, such that after the first channel layer 1021p-1 is grown, the height of the recessed portion and the thickness of the second material layer 1003 may be substantially the same. In this way, the gate stacks subsequently formed on the left and right sides of the first channel layer 1021p-1 may have substantially equal gate lengths. However, the present disclosure is not limited to this. According to the embodiments of the present disclosure, the gate length outside the first channel layer 1021p-1 may also be changed by adjusting the amount of etching back, thereby changing the ratio of the gate lengths on both sides to optimize the effect of the difference in morphology on the left and right sides of the C-shaped channel portion on the device performance.

The material of the first channel layer 1021p-1 for a p-type device may be appropriately selected according to the performance requirements of the device in the design. For example, the first channel layer 1021p-1 for a p-type device may include various semiconductor materials, such as Si, Ge, SiGe, InP, GaAs, InGaAs, etc. . . . In this example, the first channel layer 1021p-1 for a p-type device may include the same material as the first material layer and the third material layer, such as Si. In addition, when it is grown, the first channel layer 1021p-1 for a p-type device may be doped in situ as required to adjust the threshold voltage of the p-type device.

In this example, the first channel layers formed on the p-type device region and the n-type device region may have substantially the same characteristics (for example, material, size, etc.). However, the present disclosure is not limited to this. For example, according to the performance requirements of the two devices in design, the first channel layers formed on the p-type device region and the n-type device region may have different characteristics, for example, they may be different in at least one aspect of thickness, material and doping concentration. For example, for a p-type device, the first channel layer 1021p-1 may include SiGe, Ge, etc.; and for an n-type device, the first channel layer 1021n may include InGaAs, InP, or other III-V compound semiconductors. Since the first channel layer is grown thinner and a stress may be released in upper and lower directions, the quality of the film is relatively less affected by the lattice constant mismatch, and the film quality is better.

Similar to the position maintaining layer 1023a, a position maintaining layer 1025a may be formed in the recess of the bar-shaped structure R1. The position maintaining layer 1025a may include the same material as the second material layer 1003.

Figure 12:
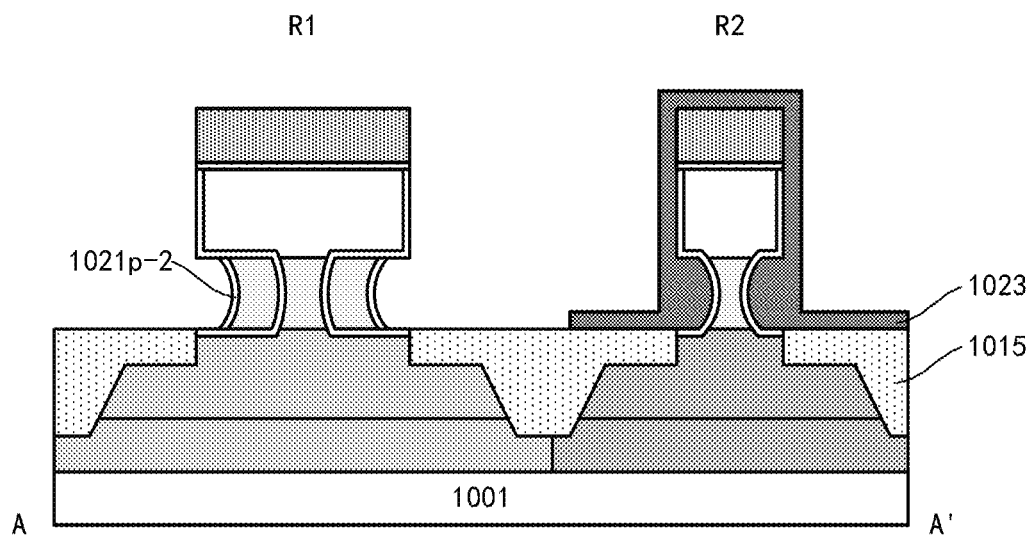

Similar to formation of the first channel layer 1021p-1, a second channel layer 1021p-2 for a p-type device may be further formed on the sidewall of the bar-shaped structure R1, as shown in FIG. 12. For example, a selective etching may be performed to the position maintaining layer 1025a so as to relatively recess sidewalls thereof in the second direction. In order to better control the amount of etching, an atomic layer etching (ALE) may be used. For example, the amount of etching may be about 10 nm-30 nm. As described above, in order to keep the gate lengths of the gate stacks subsequently formed on the left and right sides of the C-shaped channel layer substantially equal, an etching back may be performed to the bar-shaped structure R1 (more specifically, the surface of the bar-shaped structure R1 is currently covered by the position maintaining layer 1025a and the first channel layer 1021p-1, and thus the position maintaining layer 1025a and the first channel layer 1021p-1 may be etched back, and the first channel layer 1021p-1 may be completely etched back as it is thinner), and the amount of etching back may be substantially equal to the thickness of the second channel layer that is subsequently grown, for example, about 5 nm-15 nm. Of course, the ratio of the gate lengths on both sides may also be changed by adjusting the amount of etching back as described above. Then, second channel layers 1021p-2 for a p-type device may be formed on the sidewalls of the bar-shaped structure R1 and the position maintaining layer 1025a by, for example, selective epitaxial growth. The second channel layer 1021p-2 for a p-type device may then define a channel portion having a thickness of, for example, about 3 nm-15 nm. According to the embodiments of the present disclosure, the thickness of the second channel layer 1021p-2 (which is then used as a channel portion) for a p-type device may be determined by the process of the epitaxial growth, and thus the thickness of the channel portion may be better controlled.

The material of the second channel layer 1021p-2 for a p-type device may be appropriately selected according to the performance requirements of the device in the design. For example, the second channel layer 1021p-2 for a p-type device may include various semiconductor materials, such as Si, Ge, SiGe, InP, GaAs, InGaAs, etc. . . . In this example, the second channel layer 1021p-2 for a p-type device may include the same material as the first material layer and the third material layer, such as Si. In addition, when it is grown, the second channel layer 1021p-2 for a p-type device may be doped in situ as required to adjust the threshold voltage of the p-type device.

It is noted that the first channel layer 1021p-1 and the second channel layer 1021p-2 for a p-type device may be different in at least one aspect of material, thickness, doping concentration, etc. . . .

Figure 13A:
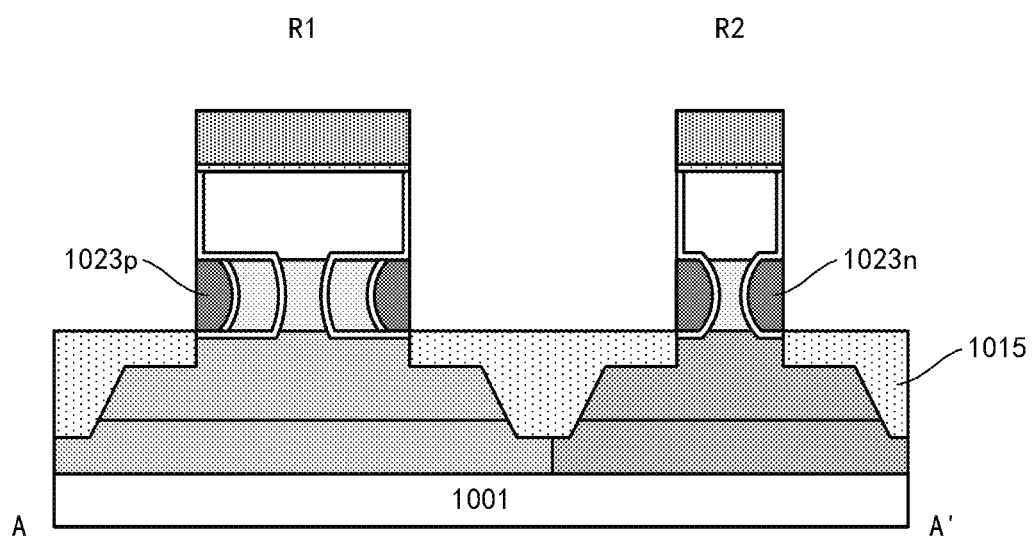
Figure 13B:
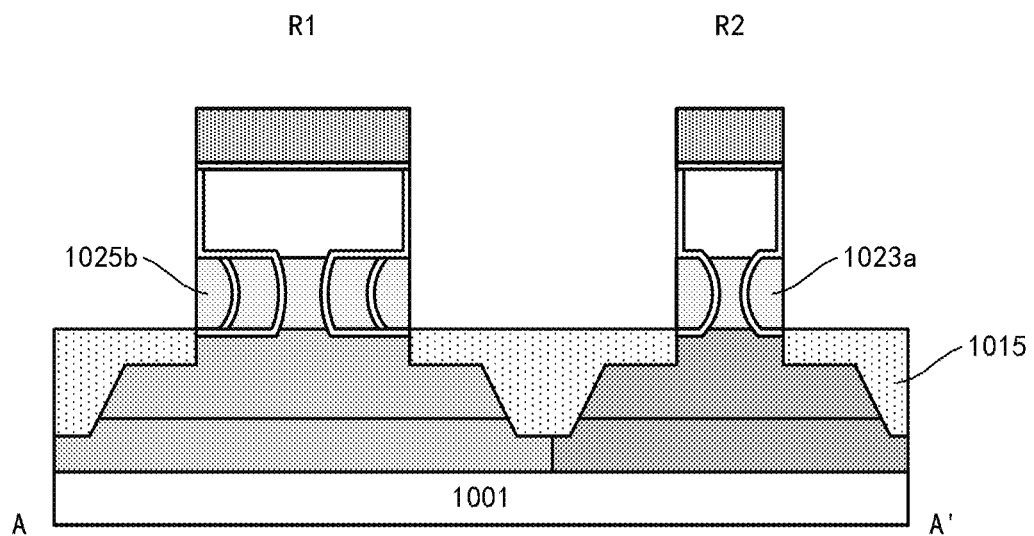

As described above, the position maintaining layers may be formed in the recesses of the bar-shaped structure. FIG. 13(a) shows a case where the position maintaining layers 1023p and 1023n of a dielectric such as SiC are formed, and FIG. 13(b) shows a case where the position maintaining layers 1023a and 1025b are formed of the same material as the second material layer 1003.

So far, an active region including the source/drain portions and the channel portion has been defined. Currently, the active region is continuous in the first direction. The bar-shaped structure may be divided into several segments in the first direction, so as to respectively define an active region for each individual device.

Figure 14A:
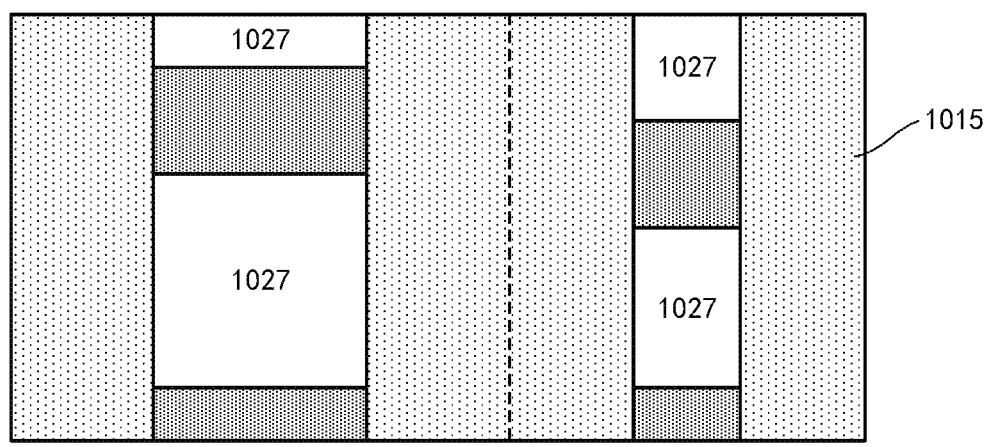
Figure 14B:
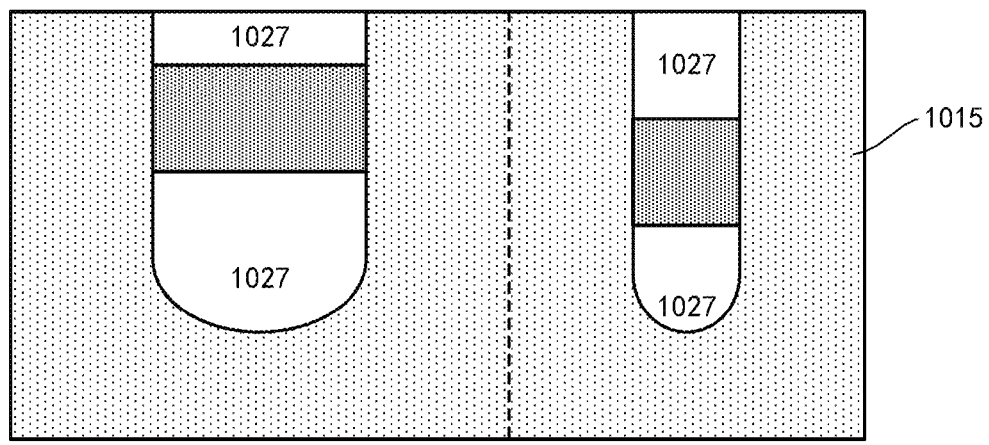

For example, as shown in FIG. 14(a), a photoresist 1027 may be formed and patterned by photolithography to shield a region where the active region of the individual device is located, thereby exposing the active regions between the individual devices. FIG. 14(b) shows the situation at the end of the bar-shaped structure.

Figure 15A:
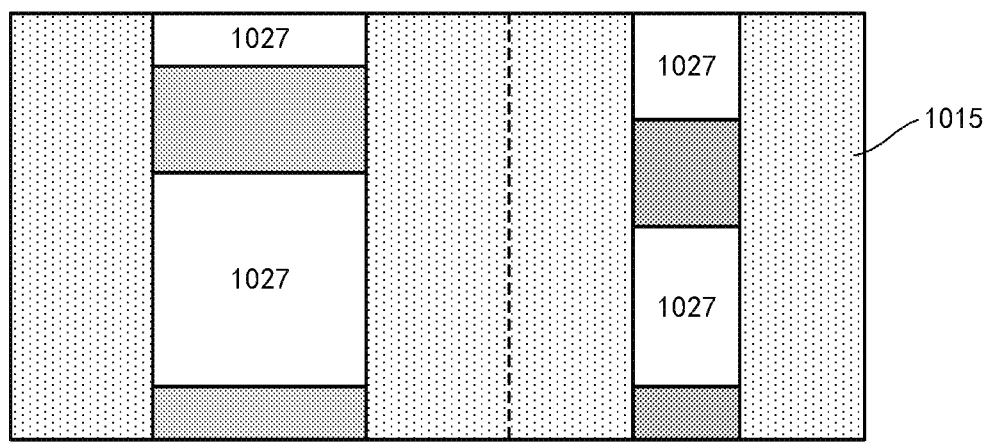
Figure 15:
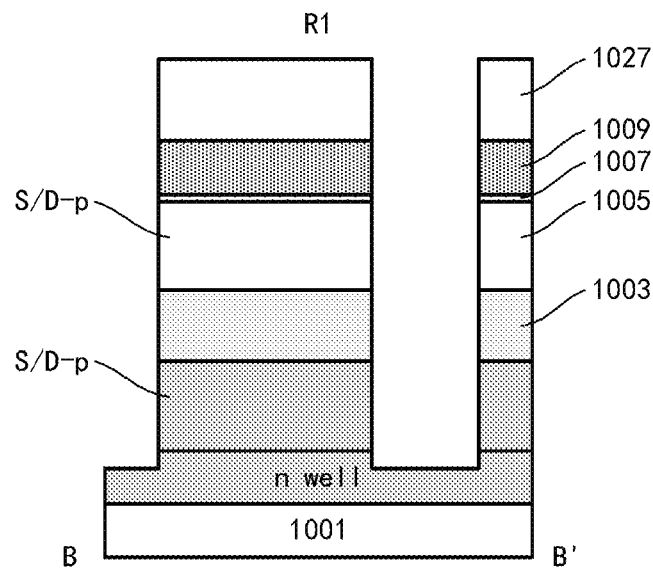

Next, as shown in FIGS. 15(a) and 15(b), the photoresist 1027 may be used as an etching mask, and the third material layer 1005 (upper source/drain portion), the second material layer 1003 (channel portion) and the first material layer (lower source/drain portion) are sequentially cut off by selective etching, such as RIE, thereby separating the active region in the first direction. It is pointed out that, according to the layout design of the device, the lower source/drain portions of some individual devices may be kept connected. Afterwards, the photoresist 1027 may be removed.

Figure 16:
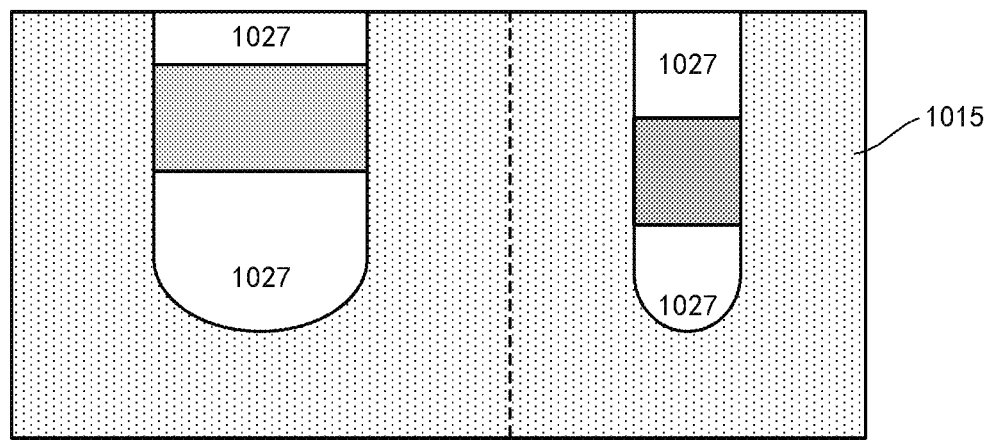
Figure 16B:
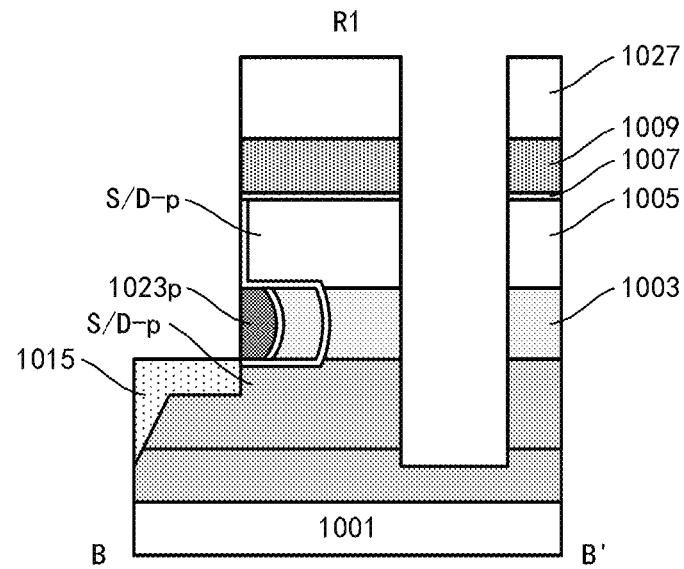
Figure 16C:
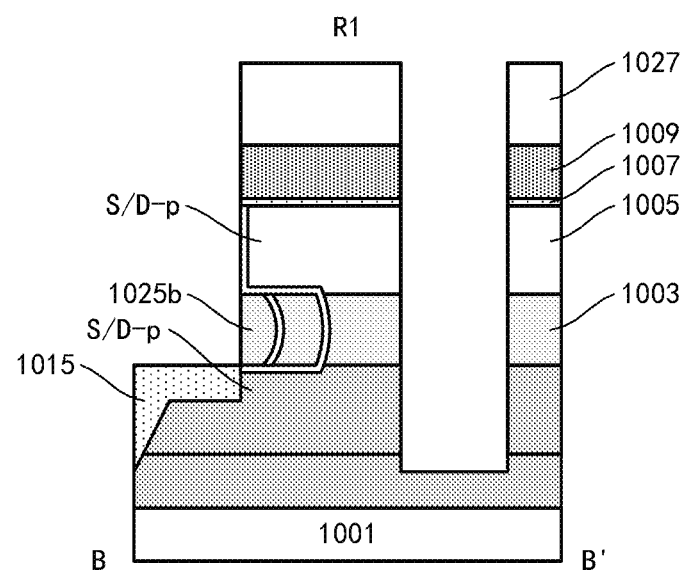

FIGS. 16(a) to 16(c) show the situation at the end of the bar-shaped structure. As shown in FIGS. 16(b) and 16(c), the channel layer may extend to the end of the bar-shaped structure. That is, for a segment separated from the bar-shaped structure and including the end of the bar-shaped structure, the channel layer may continuously extend between both sides of the segment in the second direction and an end connecting the two sides (it is noted that since the other end of the segment continuously extends with an adjacent segment, no channel layer exists, and the end is exposed through the above separation process), such that it may be represented as a U-shape in a cross-sectional view parallel to the surface of the substrate. The difference between the situations shown in FIGS. 16(b) and 16(c) lies in the difference in the position maintaining layer.

Due to the separation of the active regions of the individual devices, an isolation layer may be formed between the active regions of the individual devices. The isolation layer may be formed by depositing an oxide, planarizing the deposited oxide, and then etching back the oxide. The isolation layer thus formed is still shown as 1015 together with the isolation layer previously formed. The top surface of the isolation layer 1015 may be near the bottom surface of the original second material layer (the top surface of the first material layer), preferably not higher than the bottom surface of the second material layer, so as not to cover the channel portion.

Next, a replacement gate process may be performed to form a gate stack.

Figure 17A:
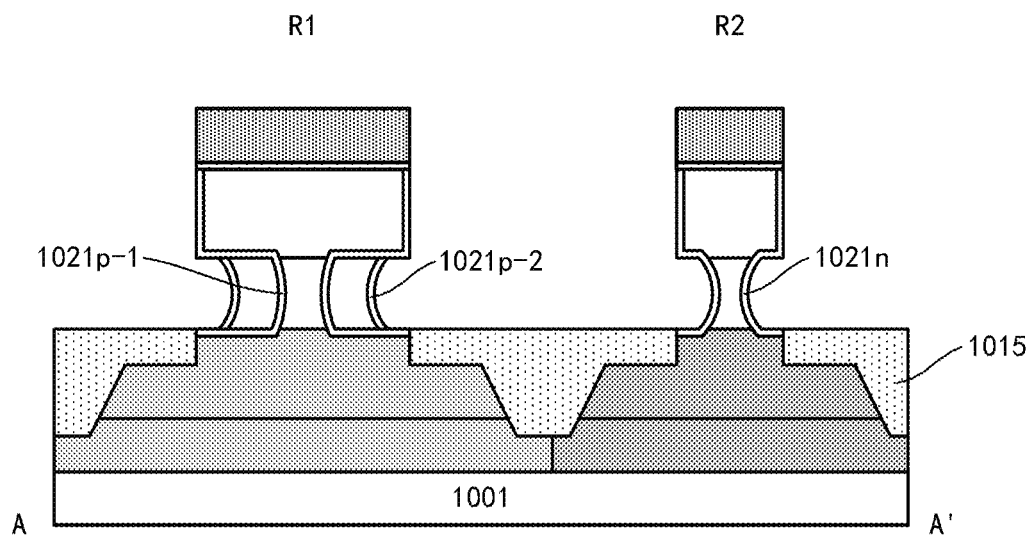
Figure 17B:
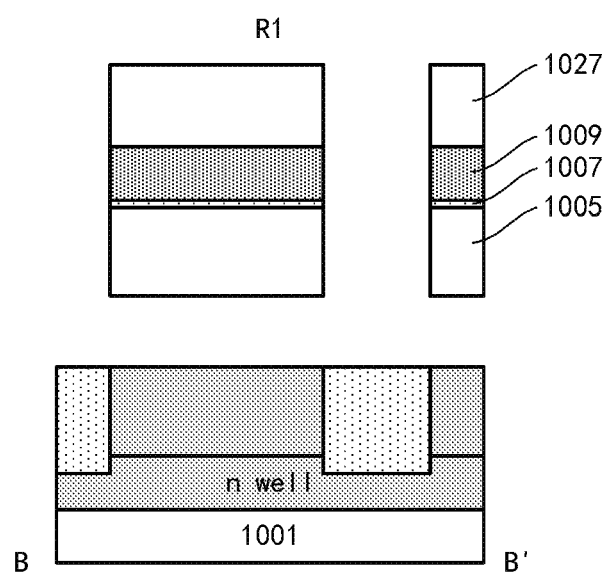
Figure 17C:
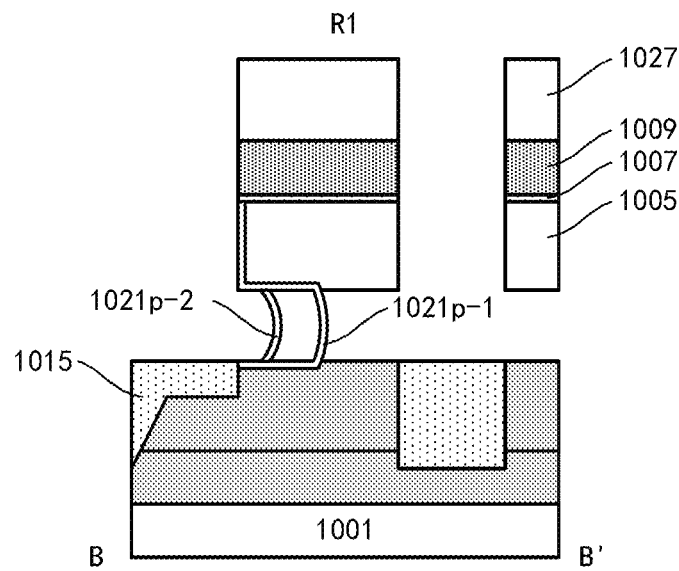

As shown in FIGS. 17(a) to 17(c), each position maintaining layer may be removed by selective etching. Oxidation treatment may be performed as required to make the corners of the C-shaped channel portion rounded, thereby improving the performance and reliability of the device. In the case of oxidation treatment, the oxide formed by the oxidation treatment may be removed by selective etching. FIG. 17(b) shows the situation of the segment at the end of a non-bar-shaped structure, and FIG. 17(c) shows the situation of the segment at the end of the bar-shaped structure.

Figure 18A:
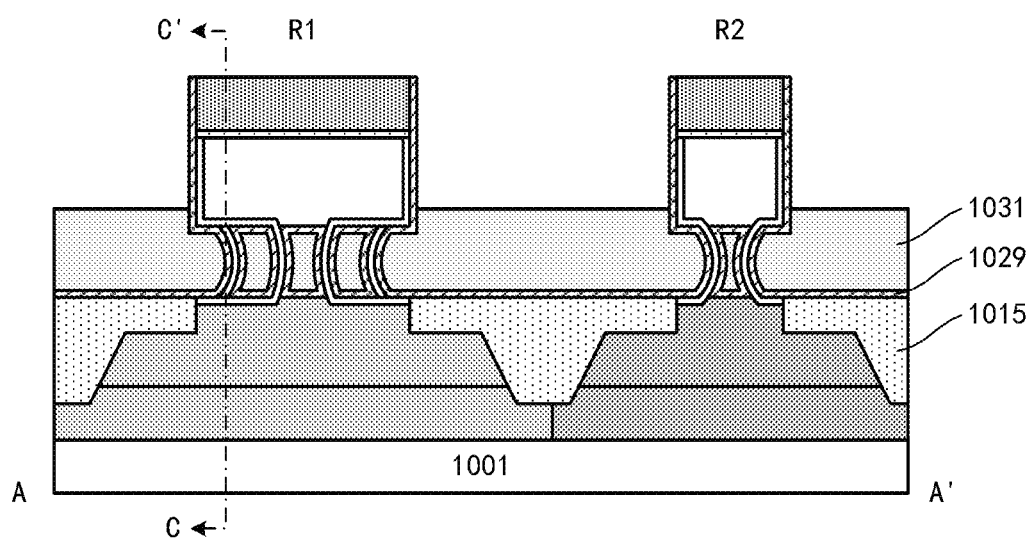
Figure 18B:
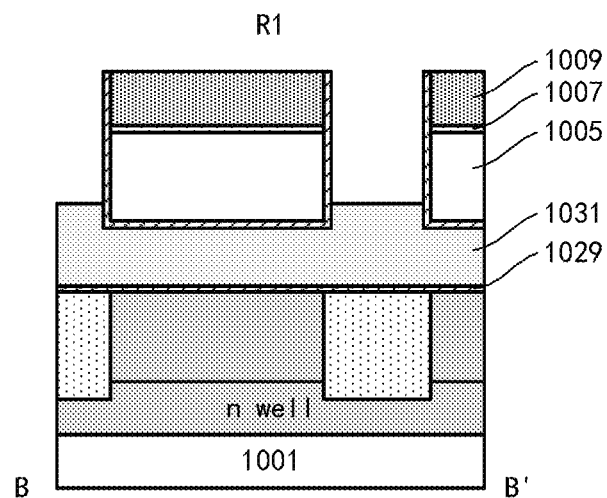
Figure 18C:
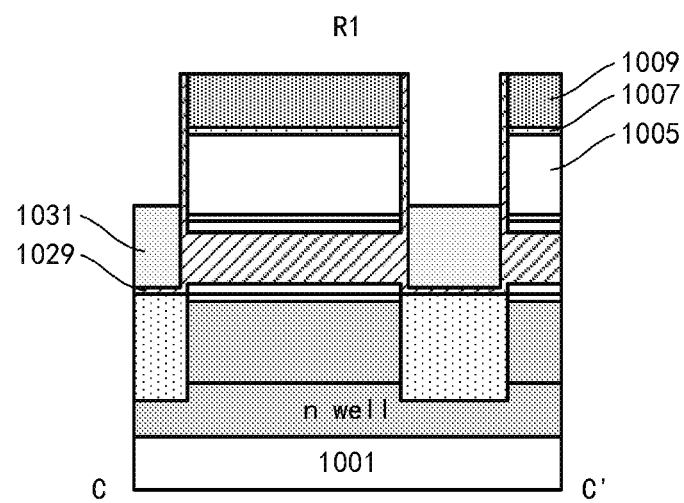
Figure 19:
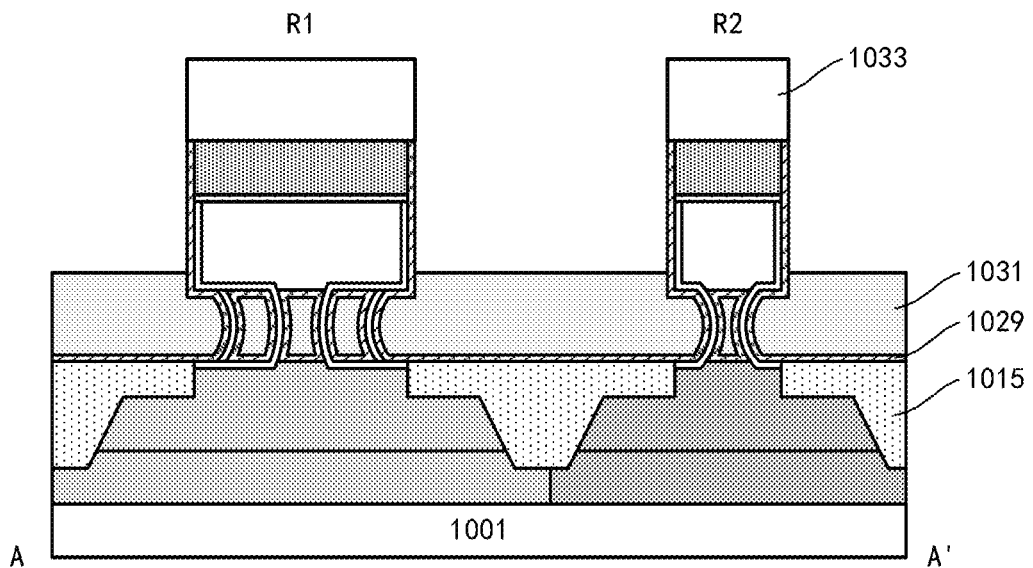
Figure 19:
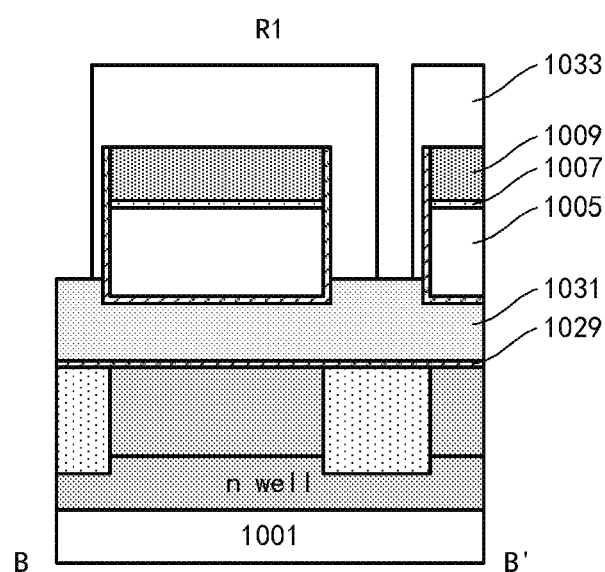
Figure 19C:
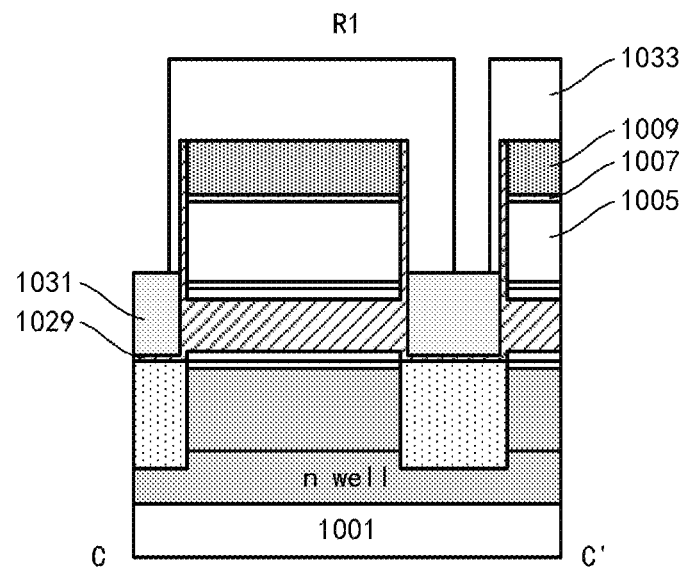
Figure 19D:
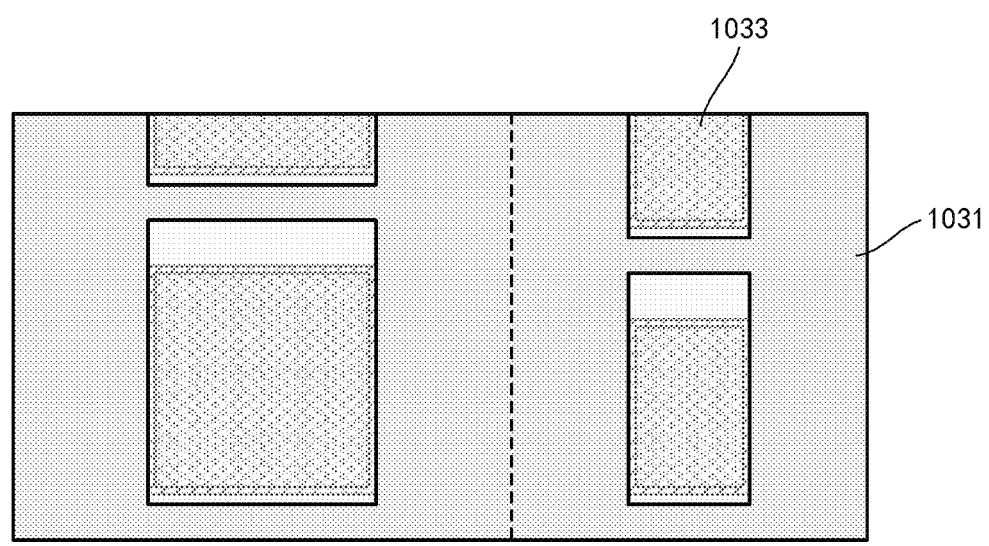

Then, as shown in FIGS. 18(a) to 18(c), a gate stack may be formed on the isolation layer 1015. For example, a gate dielectric layer 1029 may be formed in a substantially conformal manner by deposition, and a gate conductor layer 1031 is formed gate on the dielectric layer 1029. The gate conductor layer 1031 may fill the space between the active regions. A planarization processing, such as CMP, may be performed to the gate conductor layer 1031, and CMP may be stopped on the hard mask layer 1009. Then, the gate conductor layer 1031 may be etched back. The top surface of the etched back gate conductor layer 1031 is preferably higher than the original top surface of the second material layer (or the bottom surface of the third material layer) to ensure that the end of the C-shaped channel portion may be covered by the gate conductor layer, otherwise a local threshold voltage change may occur at the end of the C-shaped channel portion. In this way, the end of the formed gate stack is embedded in the space where each position maintaining layer was previously located, and surrounds the channel portion.

For example, the gate dielectric layer 1029 may include a high-k gate dielectric such as HfO2, having a thickness of, for example, about 1 nm-5 nm. Before the high-k gate dielectric is formed, an interface layer may also be formed, for example, an oxide formed by an oxidation process or deposition such as atomic layer deposition (ALD), having a thickness of about 0.3 nm-1.5 nm. Here, the gate conductor layer 1031 may be used for a p-type device, and thus may include work function adjusting metals such as TiN, TaN, etc., and gate conductive metals such as W for a p-type device.

As shown in FIG. 18(a), the gate stack surrounds the channel portion. It can be seen that the channel portion includes a C-shaped curved nanosheet (when the nanosheet is narrow, it can become a nanowire). Due to the high etching selectivity during etching of the second material layer 1003 (SiGe) relative to the channel layer (Si), the thickness of the channel portion (in the case of a nanowire, the thickness or the diameter) is basically determined by the selective growth process of the channel layer. This has a huge advantage over the technology that only uses an etching method or a photolithography method to determine the thickness, because the epitaxial growth process has much better process control than the etching or photolithography.

According to the embodiments of the present disclosure, before the gate stack is formed, an annealing treatment may also be performed such that the dopants in the source/drain portion are driven close to the C-shaped channel portion, and even a small portion of the dopants may enter both ends of the C-shaped channel portion, thereby reducing the external resistance and improving the device performance.

The gate conductor layer 1031 for a p-type device is currently also formed in the n-type device region. The gate conductor layer 1031 in the n-type device region may be removed, and a landing pad of a gate contact portion may also be patterned.

Figure 20:
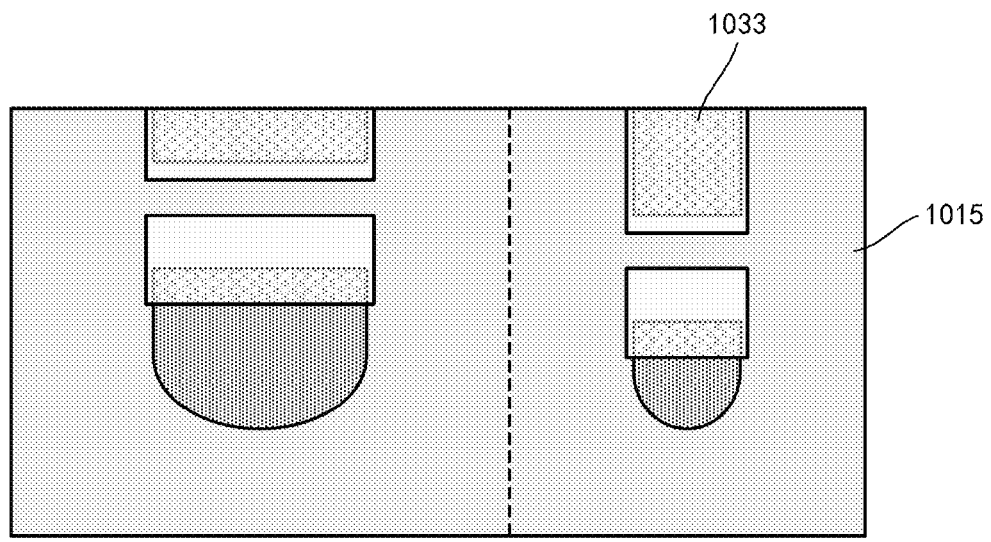
Figure 21:
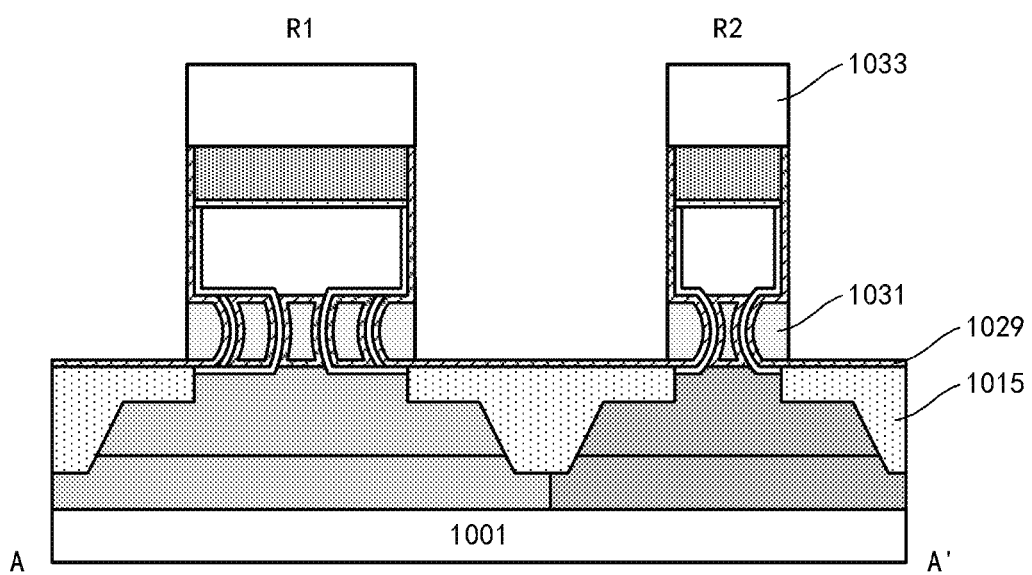
Figure 21:
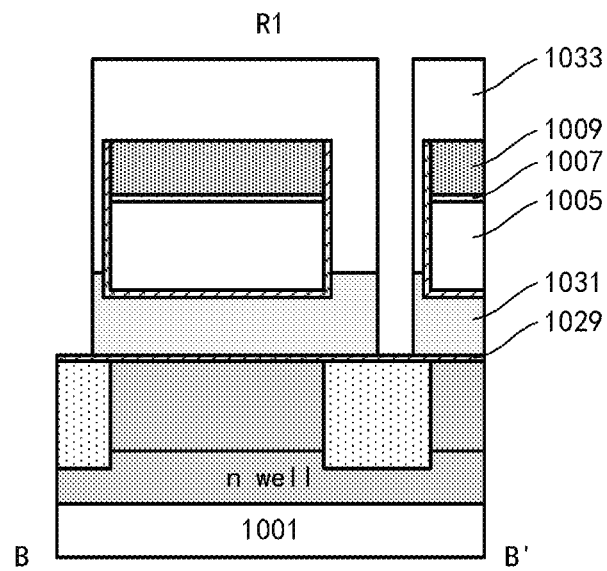
Figure 21:
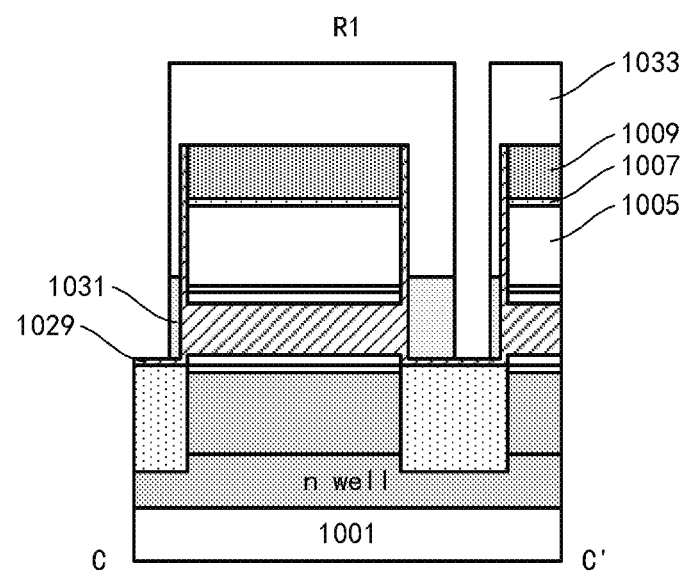

As shown in FIGS. 19(a) to 19(d), a photoresist 1033 may be formed and patterned to shield a region where the landing pad of the gate contact portion is to be formed and expose other regions. FIG. 20 shows the situation at the end of the bar-shaped structure. For convenience, in FIG. 20, the gate dielectric layer is not shown.

Then, as shown in FIGS. 21(a) to 21(c), the photoresist 1033 (and the hard mask layer 1009) may be used as a mask, selective etching such as RIE is performed on the gate conductor layer 1031, and RIE may stop at the gate dielectric layer 1029. Afterwards, the photoresist 1033 may be removed.

As a result, the gate conductor layer 1031 basically remains and is self-aligned under the hard mask layer 1009, except that a portion protrudes on a side (an upper side in the plan view) of the hard mask layer 1009 to serve as a landing pad.

Figure 22A:
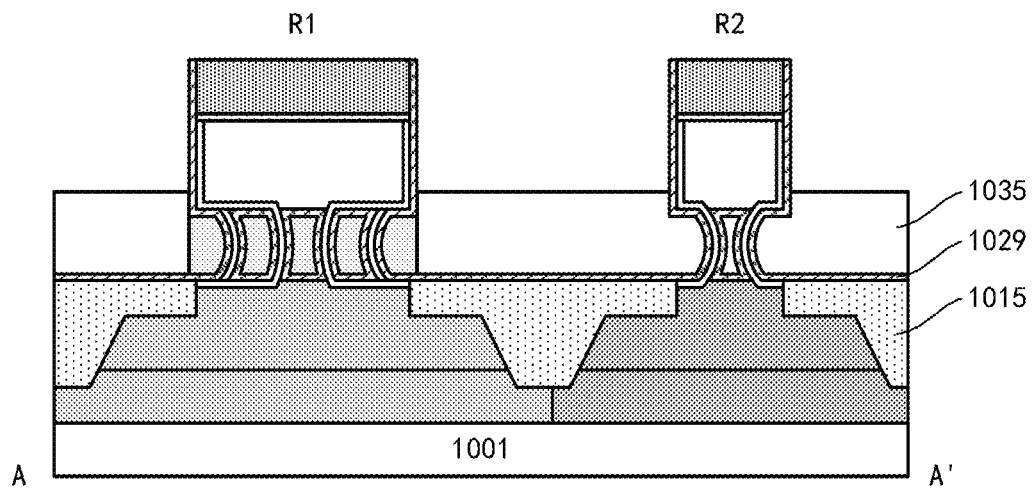
Figure 22B:
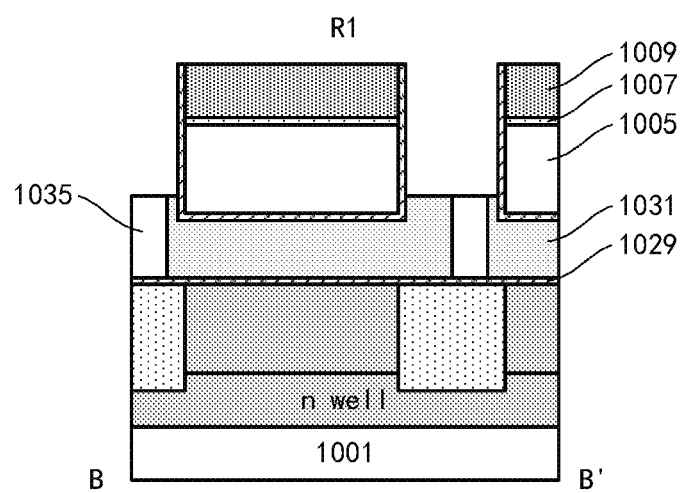
Figure 22C:
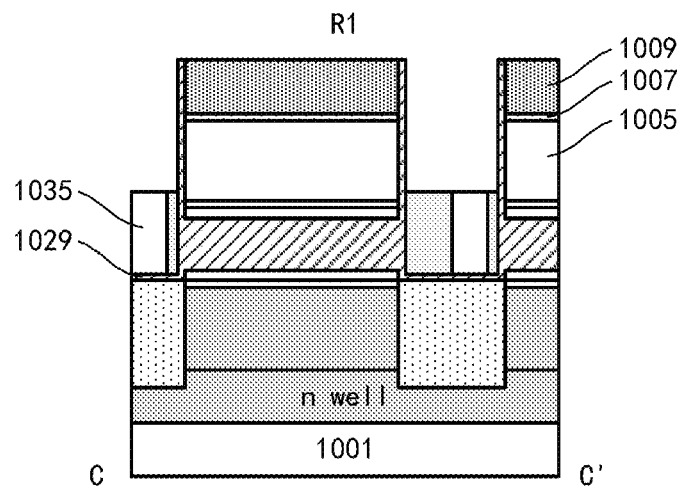

Currently, the gate conductor layer 1031 for the p-type device still remains in the n-type device region and may be removed. As shown in FIGS. 22(a) to 22(c), a shielding layer (for example, photoresist, not shown) may be formed and patterned to shield the p-type device region and expose the n-type device region. Then, the gate conductor layer 1031 in the n-type device region may be removed by selective etching. Afterwards, the shielding layer may be removed.

Then, a gate conductor layer 1035 for an n-type device may be formed in a similar manner to the gate conductor layer 1031. The gate conductor layer 1035 may include work function adjusting metals such as TiN, TaN, TiAlC, etc. and gate conductive metals such as W etc. for an n-type device.

Figure 23A:
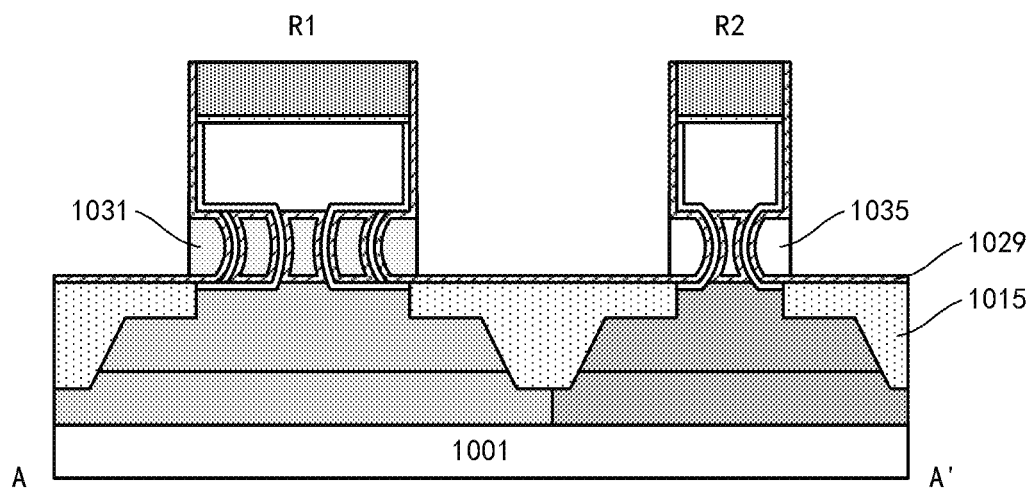
Figure 23B:
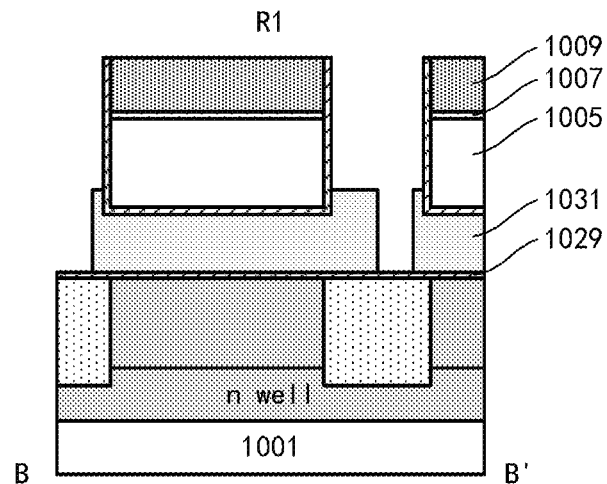
Figure 23C:
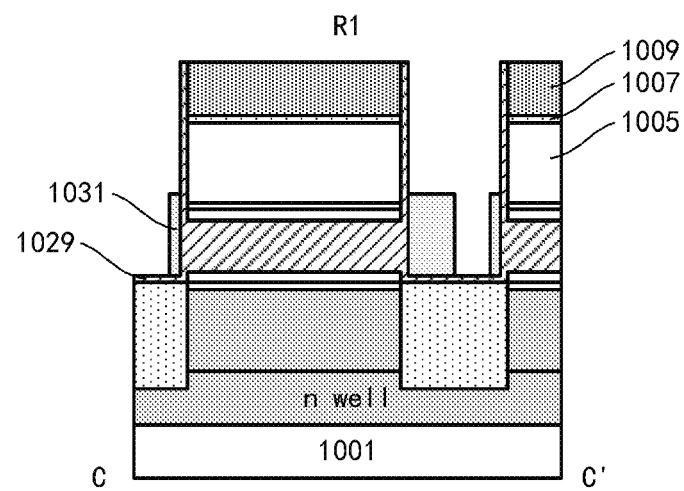

Currently, the respective gate stacks of the two devices are connected to each other into one body. According to the device design, the gate conductor layer 1035 may be disconnected between the two devices by, for example, photolithography, and the landing pad of the gate contact portion may also be patterned. This may be performed with reference to the above processing described in FIGS. 19(a) to 21(c), as shown in FIGS. 23(a) to 23(c).

Therefore, in the p-type device region, the gate conductor layer 1031 basically remains and is self-aligned under the hard mask layer 1009, except that a portion protrudes on a side (an upper side in the plan view) of the hard mask layer 1009 to serve as a landing pad. The gate conductor layer 1031 and the gate dielectric layer 1029 are combined to define a gate stack for a p-type device. Similarly, in the n-type device region, the gate conductor layer 1035 basically remains and is self-aligned under the hard mask layer 1009, except that a portion protrudes on a side (an upper side in the plan view) of the hard mask layer 1009 to serve as a landing pad. The gate conductor layer 1035 and the gate dielectric layer 1029 are combined to define a gate stack for a p-type device.

In this example, the p-type device and the n-type device have the same gate dielectric layer 1029. However, the present disclosure is not limited to this. For example, the p-type device and the n-type device may have different gate dielectric layers. When different materials are used for different types of devices, the devices may be processed separately. As described above, when a device of one type is processed, a shielding layer may be used to shield a region where a device of another type is located. Their processing orders may be exchanged.

So far, the fabrication of the basic structure of the device is completed. Subsequently, various contact portions, interconnect structures, etc. may be fabricated.

Figure 24A:
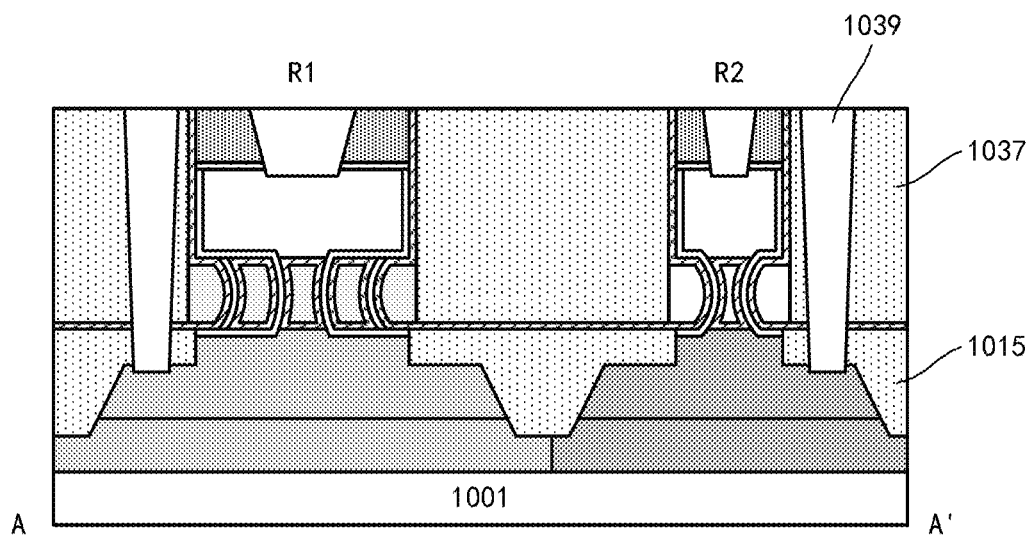
Figure 24B:
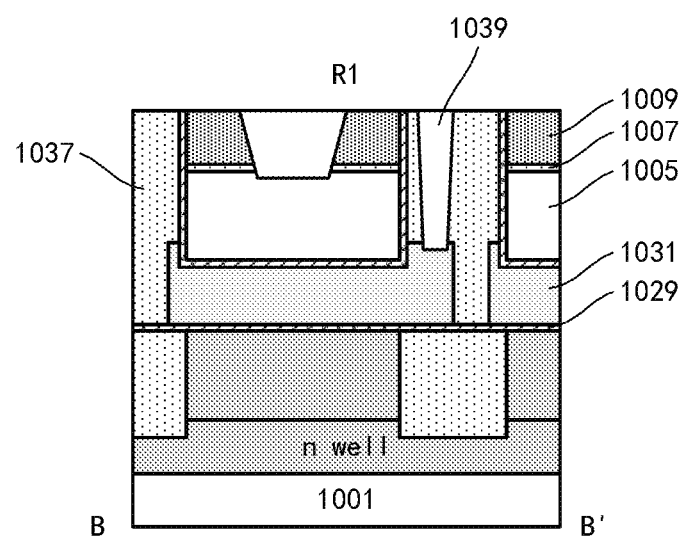
Figure 24C:
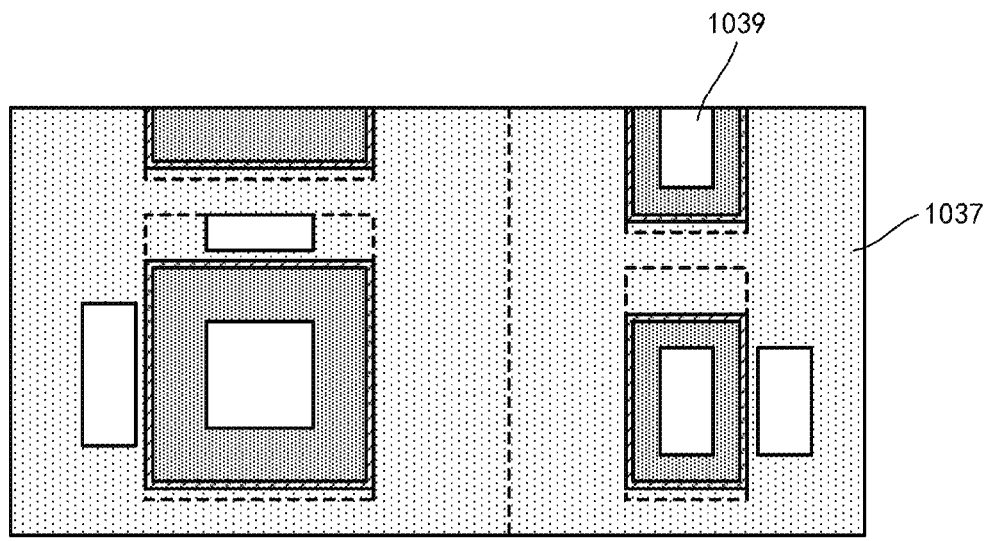

For example, as shown in FIGS. 24(a) to 24(c), a dielectric layer 1037 may be formed on the substrate by, for example, deposition and then planarization. Then, a contact hole may be formed, and conductive material such as metal may be filled in the contact hole to form a contact portion 1039. The contact portion 1039 may include a contact part that penetrates the hard mask layer 1009 and the etching stop layer 1007 and is connected to the upper source/drain portion, a contact part that penetrates the dielectric layer 1037 and the isolation layer 1015 and is connected to the contact region of the lower source/drain portion, and a contact part that penetrates the dielectric layer 1037 and is connected to the landing pad of the gate conductor layer. As shown in FIG. 24(a), the contact parts to the contact regions of the respective lower source/drain portions of two adjacent devices may be located on opposite sides (left and right sides in the figure) of the active regions.

In the above embodiments, the channel layer is of single-layer structure. However, the present disclosure is not limited to this. According to other embodiments of the present disclosure, one or more channel layers may include a structure of a plurality of sub-layers stacked.

Figure 25:
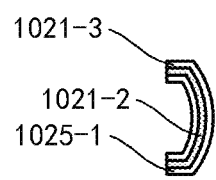
FIG. 25 schematically shows a stack configuration of a channel layer according to another embodiment of the present disclosure.

For example, as shown in FIG. 25, the channel layer (for example, the first channel layer and/or the second channel layer described above) may include a first sub-layer 1021-1, a second sub-layer 1021-2 and a third sub-layer 1021-3 which are stacked in sequence.

According to the embodiments of the present disclosure, at least some of the first sub-layer 1021-1, the second sub-layer 1021-2, and the third sub-layer 1021-3 may have different characteristics to optimize the device performance.

For example, the second sub-layer 1021-2 may include (relative to the first sub-layer 1021-1 and the third sub-layer 1021-3) a material having high carrier mobility such as SiGe (for example, the atomic percentage of Ge is about 30%-100%, when the atomic percentage of Ge is 100%, it becomes Ge) to improve the current capability of the device. However, the quality of the interface between SiGe and the gate dielectric layer formed subsequently may be poor (for example, the interface state charge density is large, the surface roughness is high, and thus the carrier scattering is large or the channel resistance is large, etc.). For this reason, the first sub-layer 1021-1 and the third sub-layer 1021-3 may include a material such as Si, the quality of the interface between such material and the gate dielectric layer being good.

For another example, the first sub-layer 1021-1 and the third sub-layer 1021-3 may include (relative to the second sub-layer 1021-2) materials having high carrier mobility, and the second sub-layer 1021-2 may include materials capable of optimizing carrier distribution.

For another example, the second sub-layer 1021-2 may confine the carriers in the first sub-layer 1021-1 and/or the third sub-layer 1021-3, so as to be closer to the gate dielectric layer. This is beneficial to improve the short channel effect and reduce leakage current. For example, for an n-type device, the lowest energy level of the conduction band of the second sub-layer 1021-2 may be higher than the lowest energy level of the conduction band of the first sub-layer 1021-1 and/or the third sub-layer 1021-3; and for a p-type device, the highest energy level of the valence band of the second sub-layer 1021-2 may be lower than the highest energy level of the valence band of the first sub-layer 1021-1 and/or the third sub-layer 1021-3.

The number of sub-layers included in each channel layer may be different, and the sub-layer stack structures in different devices may also be different.

In the above embodiments, the source/drain doping is performed by the solid phase dopant source layer. However, the present disclosure is not limited to this.

Figure 26:
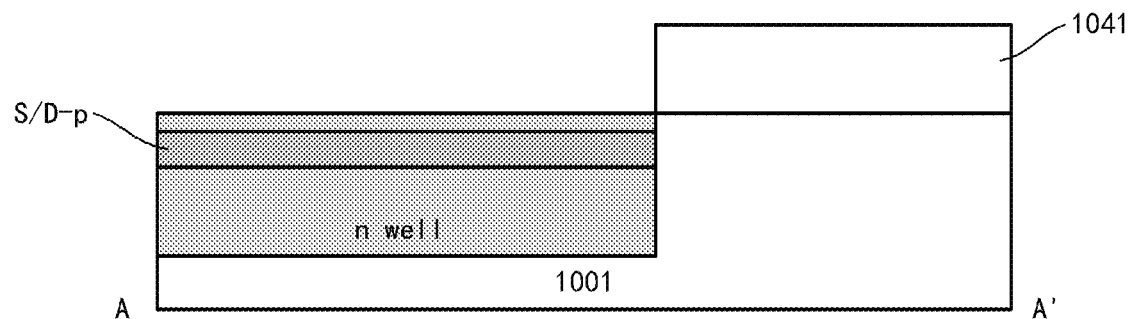

As shown in FIG. 26, on the substrate 1001, a photoresist 1041 may be used to shield the n-type device region and expose the p-type device region. In the p-type device region, an n-type well may be formed by, for example, ion injection (the concentration of the n-type impurities may be, for example, about $1E17$-$5E18$ $cm^{-3}$), and a source/drain region S/D-p (the concentration of the p-type impurities may be, for example, about $1E19$-$1E21$ $cm^{-3}$) for a p-type device may be formed in the n-type well. According to the embodiments, the concentration of the p-type impurities at the top surface may be lower than the concentration of the p-type impurities at a lower position to reduce the adverse effect on subsequent epitaxial growth.

Figure 27:
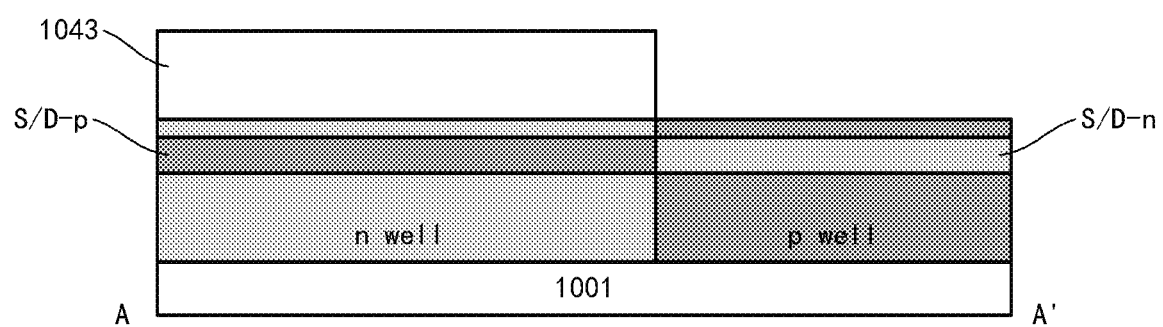

The n-type device region may be processed similarly. As shown in FIG. 27, a photoresist 1043 may be used to shield the p-type device region and expose the n-type device region. In the n-type device region, a p-type well may be formed by, for example, ion injection (the concentration of the p-type impurities may be, for example, about $1E17$-$5E18$ $cm^{-3}$), and a source/drain region S/D-n (the concentration of the n-type impurities may be, for example, about $1E19$-$1E21$ cm$^{-3}$) for an n-type device may be formed in the p-type well. According to the embodiments, the concentration of the n-type impurities at the top surface may be lower than the concentration of the n-type impurities at a lower position to reduce the adverse effect on subsequent epitaxial growth.

Figure 28:
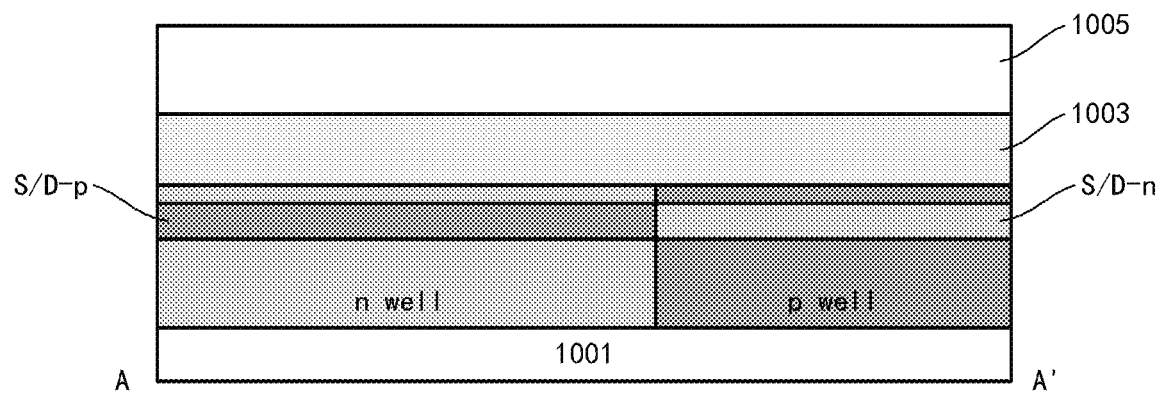

Then, as shown in FIG. 28, the second material layer 1003 and the third material layer 1005 may be formed on the substrate 1001. For this, please refer to the above description, which will not be repeated here.

Figure 29:
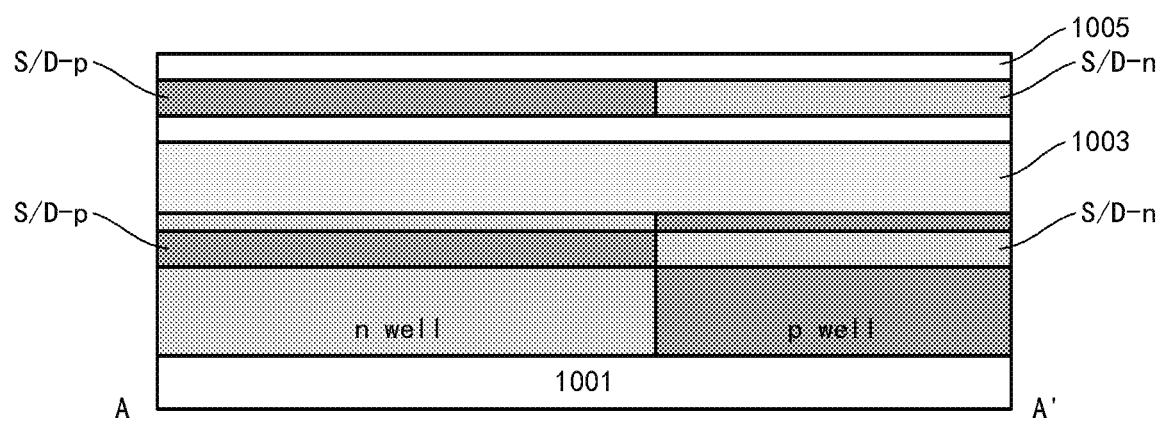

As shown in FIG. 29, through a process similar to that described with reference to FIGS. 26 and 27, a source/drain region S/D-p (the concentration of p-type impurities may be, for example, about 1E19-1E21 cm$^{-3}$) for a p-type device and a source/drain region S/D-n (the concentration of n-type impurities may be, for example, about 1E19-1E21 cm$^{-3}$) for a n-type device may be formed in the third material layer 1005.

In this case, the processing described above with reference to FIGS. 6 and 7 may be omitted. In addition, the annealing process (driving the dopants in the source/drain portion close to or even into the C-type channel portion) described above with reference to FIGS. 18(*a*) to 18(*c*) may still be used, or may be changed to be performed after the active regions of individual devices are separated as described with reference to FIGS. 15(*a*) and 15(*b*) and before the position maintaining layer is removed described with reference to FIGS. 17(*a*) to 17(*c*). This may reduce the damage caused by annealing to the less supported structure shown in FIGS. 17(*a*) to 17(*c*).

The semiconductor device according to the embodiments of the present disclosure may be applied to various electronic apparatuses. For example, an integrated circuit (IC) may be formed based on such a semiconductor device, thereby constructing an electronic apparatus. Therefore, the present disclosure also provides an electronic apparatus including the above semiconductor device. The electronic apparatus may further include components such as a display screen matched with an integrated circuit and a wireless transceiver matched with an integrated circuit. Such electronic apparatus includes smart phones, computers, tablet computers (PCs), wearable smart devices, mobile power supplies, and so on.

According to one embodiment of the present disclosure, there is further provided a method of manufacturing a system on chip (SoC). The method may include the method described above. Specifically, a variety of devices may be integrated on a chip, wherein at least some of the devices are manufactured according to the method of the present disclosure.

In the above description, the technical details such as patterning and etching of each layer are not described in detail. However, those skilled in the art should understand that various technical means may be used to form layers, regions, etc. of desired shapes. In addition, in order to form a same structure, those skilled in the art may also design a method that is not completely the same as the method described above. In addition, although the respective embodiments are described above separately, this does not mean that the measures in the respective embodiments may not be advantageously used in combination.

The above embodiments are only exemplary embodiments of the present disclosure, and are not used to limit the present disclosure, and the protection scope of the present disclosure is defined by the claims. Those skilled in the art may make various modifications or equivalent substitutions to the present disclosure within the essence and protection scope of the present disclosure, and such modifications or equivalent substitutions should also be regarded as falling within the protection scope of the present disclosure.

What is claimed is:

1. A semiconductor device comprising:
    a channel portion on a substrate, the channel portion comprising two or more curved nanosheets or nanowires spaced apart from each other in a lateral direction relative to the substrate and each having a C-shaped cross section;
    source/drain portions respectively located at upper and lower ends of the channel portion relative to the substrate; and
    a gate stack surrounding an outer circumference of each nanosheet or nanowire in the channel portion,
    wherein the two or more curved nanosheeets or nanowires share the source/drain portions respectively located at the upper and lower ends.

2. The semiconductor device according to claim 1, wherein at least some of the two or more nanosheets or nanowires are different in at least one aspect of thickness, material, and doping concentration.

3. The semiconductor device according to claim 1, wherein the substrate has a plurality of semiconductor devices, wherein at least one nanosheet or nanowire in at least one semiconductor device is different from at least one nanosheet or nanowire in at least another semiconductor device in at least one aspect of thickness, material, and doping concentration.

4. The semiconductor device according to claim 1, wherein the two or more nanosheets or nanowires comprise a pair or more pairs of nanosheets or nanowires symmetrical about a plane extending in a vertical direction relative to the substrate.

5. The semiconductor device according to claim 4, wherein the plane is a center plane of the source/drain portion at the upper end of the channel portion.

6. The semiconductor device according to claim 4, wherein the substrate has a plurality of the semiconductor devices, wherein respective channel portions of at least some of the semiconductor devices are substantially coplanar.

7. The semiconductor device according to claim 6, wherein respective upper source/drain portions of the at least some semiconductor devices are substantially coplanar, and respective lower source/drain portions thereof are substantially coplanar.

8. The semiconductor device according to claim 1, wherein the substrate has a plurality of semiconductor devices, wherein numbers of nanosheets or nanowires comprised in the channel portions of at least some of the semiconductor devices are different.

9. The semiconductor device according to claim 8, wherein the plurality of the semiconductor devices comprise an n-type semiconductor device and a p-type semiconductor device, wherein a number of nanosheets or nanowires comprised in the channel portion of the p-type semiconductor device is twice a number of nanosheets or nanowires comprised in the channel portion of the n-type semiconductor device.

10. The semiconductor device according to claim 1, wherein each of the two or more nanosheets or nanowires has a substantially uniform thickness.

11. The semiconductor device according to claim 1, wherein at least a portion of the gate stack adjacent to the channel portion is substantially coplanar with the channel portion.

12. The semiconductor device according to claim 1, wherein at least a portion of an outer circumference of the gate stack extends along a corresponding outer circumference of the source/drain portion at the upper end of the channel portion.

13. The semiconductor device according to claim 1, wherein the highest surface of a gate conductor layer in the gate stack is higher than a top surface of the channel portion.

14. The semiconductor device according to claim 1, wherein the channel portion and/or the source/drain portion comprises a single crystal semiconductor material.

15. The semiconductor device according to claim 1, wherein, in a cross section extending laterally relative to the substrate, the two or more nanosheets or nanowires substantially extend in parallel.

16. The semiconductor device according to claim 1, wherein, in the cross section extending laterally relative to the substrate, each of the two or more nanosheets or nanowires is U-shaped.

17. The semiconductor device according to claim 1, wherein on opposite sides of at least one curved nanosheet or nanowire, of the two or more curved nanosheets or nanowires, in the lateral direction, gate lengths of the gate stacks are substantially equal.

18. An electronic apparatus comprising a semiconductor device according to claim 1.

19. The electronic apparatus according to claim 18, comprising at least one selected from a group consisting of smart phones, computers, tablet computers, wearable smart devices, artificial intelligence devices, and mobile power supplies.

20. The semiconductor device according to claim 1, wherein at least one of the two or more nanosheets or nanowires comprises a plurality of sub-nanosheets or sub-nanowires that are sequentially stacked in the lateral direction and each having a C-shaped cross section.

21. The semiconductor device according to claim 20, wherein at least some of the plurality of sub-nanosheets or sub-nanowires have different characteristics.

22. The semiconductor device according to claim 21, wherein the plurality of sub-nanosheets or sub-nanowires comprise a first sub-nanosheet or sub-nanowire and a second sub-nanosheet or sub-nanowire which are respectively located on both sides of a corresponding nanosheet or nanowire in the lateral direction and have an improved interface quality with the gate stack, and a third sub-nanosheet or sub-nanowire which is located between the first sub-nanosheet or sub-nanowire and the second sub-nanosheet or sub-nanowire and has high carrier mobility.

23. The semiconductor device according to claim 21, wherein the plurality of sub-nanosheets or sub-nanowires comprise a first sub-nanosheet or sub-nanowire and a second sub-nanosheet or sub-nanowire which are respectively located on both sides of a corresponding nanosheet or nanowire in the lateral direction and have high carrier mobility, and a third sub-nanosheet or sub-nanowire which is located between the first sub-nanosheet or sub-nanowire and the second sub-nanosheet or sub-nanowire and may optimize carrier distribution.

24. The semiconductor device according to claim 21, wherein the plurality of sub-nanosheets or sub-nanowires comprise a first sub-nanosheet or sub-nanowire and a second sub-nanosheet or sub-nanowire which are respectively located on both sides of a corresponding nanosheet or nanowire in the lateral direction, and a third sub-nanosheet or sub-nanowire which is located between the first sub-nanosheet or sub-nanowire and the second sub-nanosheet or sub-nanowire, wherein, for an n-type semiconductor device, the lowest energy level of a conduction band of the third sub-nanosheet or sub-nanowire is higher than the lowest energy level of a conduction band of the first sub-nanosheet or sub-nanowire and/or the second sub-nanosheet or sub-nanowire; or for a p-type semiconductor device, the highest energy level of a valence band of the third sub-nanosheet or sub-nanowire is lower than the highest energy level of a valence band of the first sub-nanosheet or sub-nanowire and/or the second sub-nanosheet or sub-nanowire.

25. The semiconductor device according to claim 20, wherein the at least one is two or more, wherein a stack of sub-nanosheets or sub-nanowires comprised in at least one nanosheet or nanowire is different from a stack of sub-nanosheets or sub-nanowires comprised in at least another nanosheet or nanowire.

26. The semiconductor device according to claim 20, wherein the substrate has a plurality of semiconductor devices, wherein a stack of sub-nanosheets or sub-nanowires comprised in at least one nanosheet or nanowire in at least one semiconductor device is different from a stack of sub-nanosheets or sub-nanowires comprised in at least one nanosheet or nanowire in at least another semiconductor device.

27. The semiconductor device according to claim 20, wherein each of the plurality of sub-nanosheets or sub-nanowires has a substantially uniform thickness.

28. A method of manufacturing a semiconductor device, comprising:
providing a stack of a first material layer, a second material layer and a third material layer on a substrate;
patterning the stack into a bar-shaped structure extending along a first direction;
forming source/drain portions in the first material layer and the third material layer;
on opposite sides of the bar-shaped structure in a second direction intersecting with the first direction, laterally recessing a sidewall of the second material layer relative to sidewalls of the first material layer and the third material layer, so as to define a first recessed portion;
forming a first channel layer on a sidewall of the second material layer exposed by the first recessed portion;
forming a first position maintaining layer in a remaining space of the first recessed portion;
separating the bar-shaped structure into several segments in the first direction;
forming an isolation layer on the substrate;
removing the second material layer and the first position maintaining layer; and
forming a gate stack around the first channel layer on the isolation layer.

29. The method according to claim 28, further comprising:
on the opposite sides of the bar-shaped structure in the second direction, laterally recessing a sidewall of the first position maintaining layer relative to the sidewalls of the first material layer and the third material layer, so as to define a second recessed portion;
forming a second channel layer on a sidewall of the first position maintaining layer exposed by the second recessed portion; and
forming a second position maintaining layer in a remaining space of the second recessed portion; wherein removing the second material layer and the first position maintaining layer further comprises removing the second position maintaining layer.

30. The method according to claim 28, wherein the bar-shaped structure has an end in the first direction, the recessing operation is also directed to the end, and the recessed portion obtained therefrom also extend to the end.

31. The method according to claim 29, wherein a plurality of semiconductor devices are formed on a substrate, wherein the second channel layer is formed only for a portion of the semiconductor devices.

32. The method according to claim 29, wherein forming the first position maintaining layer comprises epitaxially growing the first position maintaining layer on the first channel layer.

33. The method according to claim 28, wherein the first material layer is an upper portion of the substrate or an epitaxial layer on the substrate.

34. The method according to claim 28, wherein the second material layer has etching selectivity relative to the first material layer and the third material layer.

35. The method according to claim 28, wherein recessing the sidewall of the second material layer comprises isotropic etching.

36. The method according to claim 28, wherein forming the first channel layer comprises selective epitaxial growth.

37. The method according to claim 28, wherein forming source/drain portions comprises:

forming a dopant source layer on the sidewall of the bar-shaped structure; and driving dopants in the dopant source layer into the first material layer and the third material layer.

38. The method according to claim 28, wherein after defining the first recessed portion and before forming the first channel layer, the method further comprises:

etching back an exposed surface of a ridge structure to a thickness that is substantially the same as a thickness of the first channel layer to be formed.

* * * * *